United States Patent [19]

Sakashita et al.

[11] Patent Number: 5,493,506
[45] Date of Patent: Feb. 20, 1996

[54] INTEGRATED CIRCUIT DEVICE AND METHOD OF DESIGNING SAME

[75] Inventors: Kazuhiro Sakashita; Isao Takimoto; Terukazu Yusa; Takeshi Hashizume; Tatsunori Komoike, all of Itami, Japan

[73] Assignee: Mitsubishi Denki Kabushiki Kaisha, Tokyo, Japan

[21] Appl. No.: 120,390

[22] Filed: Sep. 14, 1993

[30] Foreign Application Priority Data

Jan. 14, 1993 [JP] Japan ................................. 5-004622

[51] Int. Cl.⁶ ..................................................... C06F 17/50
[52] U.S. Cl. ........................... 364/489; 364/490; 364/491; 364/488
[58] Field of Search ................................. 364/488, 489, 364/490, 491

[56] References Cited

U.S. PATENT DOCUMENTS

| | | | |
|---|---|---|---|
| 4,433,384 | 2/1984 | Berrian et al. .................... | 364/525 |
| 4,641,247 | 2/1987 | Laugesen et al. .................. | 364/490 |
| 4,670,846 | 6/1987 | Laws ................................. | 364/490 |
| 4,686,629 | 8/1987 | Noto et al. . | |
| 4,812,962 | 3/1989 | Witt .................................. | 364/490 |
| 4,951,221 | 8/1990 | Corbett et al. .................... | 364/489 |
| 5,010,511 | 4/1991 | Hartley et al. .................... | 364/786 |
| 5,117,277 | 5/1992 | Yuyama et al. . | |
| 5,172,330 | 12/1992 | Watanabe et al. . | |
| 5,229,629 | 7/1993 | Koike . | |
| 5,303,200 | 4/1994 | Elrod et al. ........................ | 365/230.05 |

OTHER PUBLICATIONS

IEEE 1985 Custom Integrated Circuits Conference, May 1985, Rob Walker, et al., "Structured Arrays—A New Asic Concept Provides the Best of Gate Arrays and Cell Based Custom", pp. 252–257.

IEEE Journal of Solid–State Circuits, vol. SC–17, No. 3, Jun. 1982, Michel Bauge, et al., "A Highly Automated Semi–Customn Approach for VLSI", pp. 465–472.

Digital Design, vol. 16, No. 9, Aug. 1986, Joseph ASEO, "Bit–Slice Processors Blend Flexibility and Performance", pp. 54–57.

*Primary Examiner*—Kevin J. Teska
*Assistant Examiner*—Susan Wieland
*Attorney, Agent, or Firm*—Oblon, Spivak, McClelland, Maier & Neustadt

[57] ABSTRACT

A register circuit an arithmetic circuit a register circuit and a logic circuit form a bit slice cell corresponding to a path of propagation connecting the circuits in this order. Similarly, an arithmetic circuit register circuits and a logic circuit form a bit slice cell and an arithmetic circuit register circuits and a logic circuit form a bit slice cell. The bit slice cells are arranged generally in parallel to form a bit slice circuit which prevents redundant lines for connecting the functional circuits, whereby the bit slice circuit is developed in a short period without a decreased degree of integration and prolonged delay time.

34 Claims, 23 Drawing Sheets

INTEGRATED CIRCUIT DEVICE AND METHOD OF DESIGNING SAME

BACKGROUND OF THE INVENTION

1. Field of the Invention

The present invention relates to an integrated circuit device which achieves a circuit having arithmetic functions and, more particularly, to an integrated circuit device provided by using a gate array design system and a method of designing the same.

2. Description of the Background Art

Recently, electronic circuit devices have found rapid advances, and a need liar short-term development of high-performance and high-function devices has been accelerated. Integrated circuit devices which are a key to the short-term development of the electronic circuit devices are also required to be developed in a short period and to be of high performance and high function. A circuit for performing high-function arithmetic operations by the combination of various functional circuits such as arithmetic circuits, register circuits and logic circuits, which is one type of the integrated circuit devices (hereinafter referred to as a bit slice circuit), has been developed by using a custom design or cell base design system for high performances such as high operational speeds.

A need has arisen recently for further reduction in development period of the high-performance and high-function bit slice circuit. The custom design or cell base design system is, however, difficult to meet the period reduction requirement.

SUMMARY OF THE INVENTION

According to the present invention, an integrated circuit device comprises: a plurality of bit slice cells, each of the bit slice cells including at least one functional circuit for achieving a predetermined function, the at least one functional circuit in each of tile bit slice cells being arranged in at least one row and interconnected.

Preferably, the at least one functional circuit is arranged in a plurality of rows in at least one of the bit slice cells.

Preferably, the at least one functional circuit is arranged in a row in each of the bit slice cells.

Preferably, the functional circuits which achieve the same function form a functional block, and the functional circuits are arranged in a column for each functional block.

Preferably, the integrated circuit device further comprises a clock driver for driving the functional circuits, and the integrated circuit device is divided into a first region in which the bit slice cells are placed and a second region in which the clock driver is placed.

Preferably, the integrated circuit device is divided into a first region in which the bit slice cells are placed and a second region different from the first region, and the integrated circuit device further comprises: a connecting line; and a memory circuit connected to the functional circuits with the connecting line and placed in the second region such that the total length of the connecting line is minimized.

In the integrated circuit device of the present invention, data to be used for processing in the bit slice cells is propagated.

The integrated circuit device of the present invention wherein the length of lines between the functional circuits is not unnecessarily long can prevent a decreased degree of integration and a prolonged delay time.

The present invention is also intended for a method of designing an integrated circuit device. According to the present invention, the method comprises the steps of: (a) making a logic design for an integrated circuit performing a predetermined processing to determine a logic design circuit; (b) dividing the logic design circuit into units of the predetermined processing to determine a plurality of bit slice cells each having at least one functional circuit for achieving a predetermined function; (c) specifying a predetermined region; (d) placing the bit slice cells generally in parallel in the predetermined region; and (e) determining routing of wiring between the functional circuits.

In another aspect of the invention, the method comprises the steps of: (a) making a logic design for an integrated circuit performing a predetermined processing to determine a logic design circuit; (b) dividing the logic design circuit to determine a plurality of functional circuit blocks each including at least one functional circuit for achieving the same function; (c) specifying a predetermined region; (d) dividing the predetermined region into units of the predetermined processing to determine bit regions; (c) placing the functional circuit blocks across at least two of the bit regions; and (f) determining routing of wiring between the functional circuits.

Preferably, the step (b) includes the step of: (b-1) dividing the functional circuit blocks into units of the predetermined processing, and the step (e) includes the step of: (e-1) placing the functional circuits in the bit regions, respectively, in accordance with the processing units.

In still another aspect of the present invention, the method comprises the steps of: (a) making a logic design for an integrated circuit performing a predetermined processing to determine a logic design circuit; (b) dividing the logic design circuit into functional circuits each for achieving a predetermined function; (c) specifying a predetermined region; (d) dividing the predetermined region into units of the predetermined processing to determine bit regions; (e) placing the functional circuits in the bit regions; and (f) determining routing of wiring between the functional circuits.

In a further aspect of the present invention, the method comprises the steps of: (a) specifying a predetermined range; (b) placing a connecting terminal at an edge of the predetermined range; (c) placing a plurality of bit slice cells generally in parallel in the predetermined range, each of the bit slice cells including at least one functional circuit for achieving a predetermined function; (d) placing the functional circuits in each of the bit slice cells; and (e) determining routing of wiring between the functional circuits.

In the method of the present invention, the paths through which data is propagated in units of processing are arranged generally in parallel.

The method of the present invention wherein the gate array design system is applied thereto and a functional circuit is placed in each unit of processing, provides for short-term design of the integrated circuit device of the present invention.

An object of the present invention is to provide a bit slice circuit which is developed in a shorter period without decreasing the degree of integration, operational speeds and speed uniformity thereof, and a method of designing the same.

These and other objects, features, aspects and advantages of the present invention will become more apparent from the following detailed description of the present invention when taken in conjunction with the accompanying drawings.

DESCRIPTION OF THE PREFERRED EMBODIMENTS

A. Fundamental Idea

Prior to the description of preferred embodiments, the fundamental idea of the present invention will be described hereinafter. The gate array design system is considered to achieve early development of bit slice circuits. In the gate array design system, however, logic circuits forming a bit slice circuit are sometimes arranged in dispersed relation on an integrated circuit device, resulting in wiring of large load capacity. In some cases, a mere application of the gate array design system to the bit slice circuit is difficult to constantly attain high performances such as a higher degree of integration, higher operational speeds, and speed uniformity.

Figure 41:
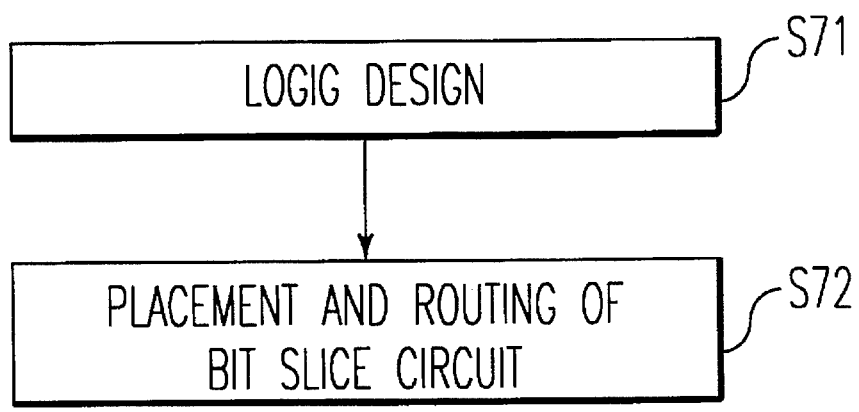
FIG. 41 is a flow chart illustrating the fundamental idea of the present invention.

FIG. 41 illustrates a flow of development of a bit slice circuit using the conventional gate array design system. In the mere application of the conventional gate array design system to the development of the bit slice circuit, the step of placement and routing (step S72) immediately follows the completion of logic design (step S71). The step of placement and routing is repeated until the performances specified by initial specifications are satisfied. Such a flow causes the development period to be prolonged because of the repeated placement and routing step until the satisfaction of the initial circuit specifications.

Figure 42:
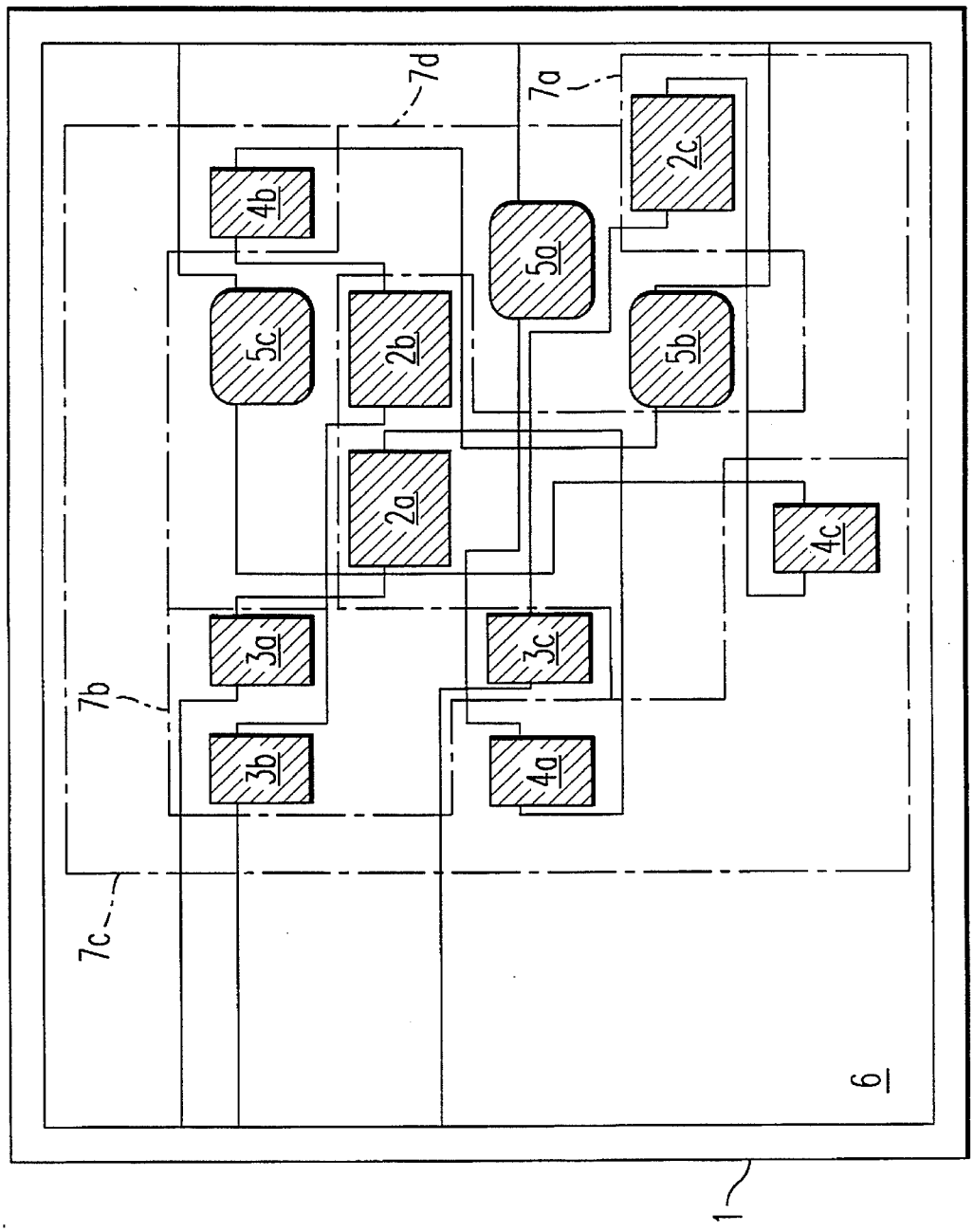
FIGS. 42 and 43 are block diagrams illustrating the fundamental idea of the present invention.

FIG. 42 illustrates a bit slice circuit provided by the development flow of FIG. 41. A bit slice circuit 6 is provided in an integrated circuit device 1 and comprises arithmetic circuits 2a to 2c, register circuits 3a to 3c, 4a to 4c, and logic circuits 5a to 5c. These various functional circuits are included in functional circuit blocks 7a, 7b, 7c, 7d, respectively. There are three paths of propagation of data for arithmetic operations in the bit slice circuit 6, that is 3a–2a–5a–4a, 3b–2b–5b–4b, 3c–2c–5c–4c, each of which corresponds to a bit of the arithmetic operation. In FIG. 42, the bit slice circuit 6 which has paths of propagation for three bits is a 3-bit bit slice circuit. (Likewise, an n-bit bit slice circuit includes n paths of data propagation.)

One bit (the unit of processing in the bit slice circuit) of the data accepted by the bit slice circuit 6 is held in the register circuit 3a and is then transmitted to the arithmetic circuit 2a in response to a clock signal not shown. The data subjected to the arithmetic operation in the arithmetic circuit 2a is held in the register circuit 4a and is then transmitted to the logic circuit 5a in response to the clock signal. The data is subjected to a logical processing in the logic circuit 5a and is then outputted from the bit slice circuit 6. Other bits of the data accepted by the bit slice circuit 6 are subjected to the same processings along the paths of propagation and are then outputted from the bit slice circuit 6.

In the bit slice circuit 6 provided by the mere application of the conventional gate array design system which has the above-mentioned structure, the functional circuits forming the bit slice circuit 6 are in some cases arranged in dispersed relation on the integrated circuit device 1. The result might be an increased wiring length between the functional circuits, a decreased degree of integration, and a prolonged delay time.

Figure 43:
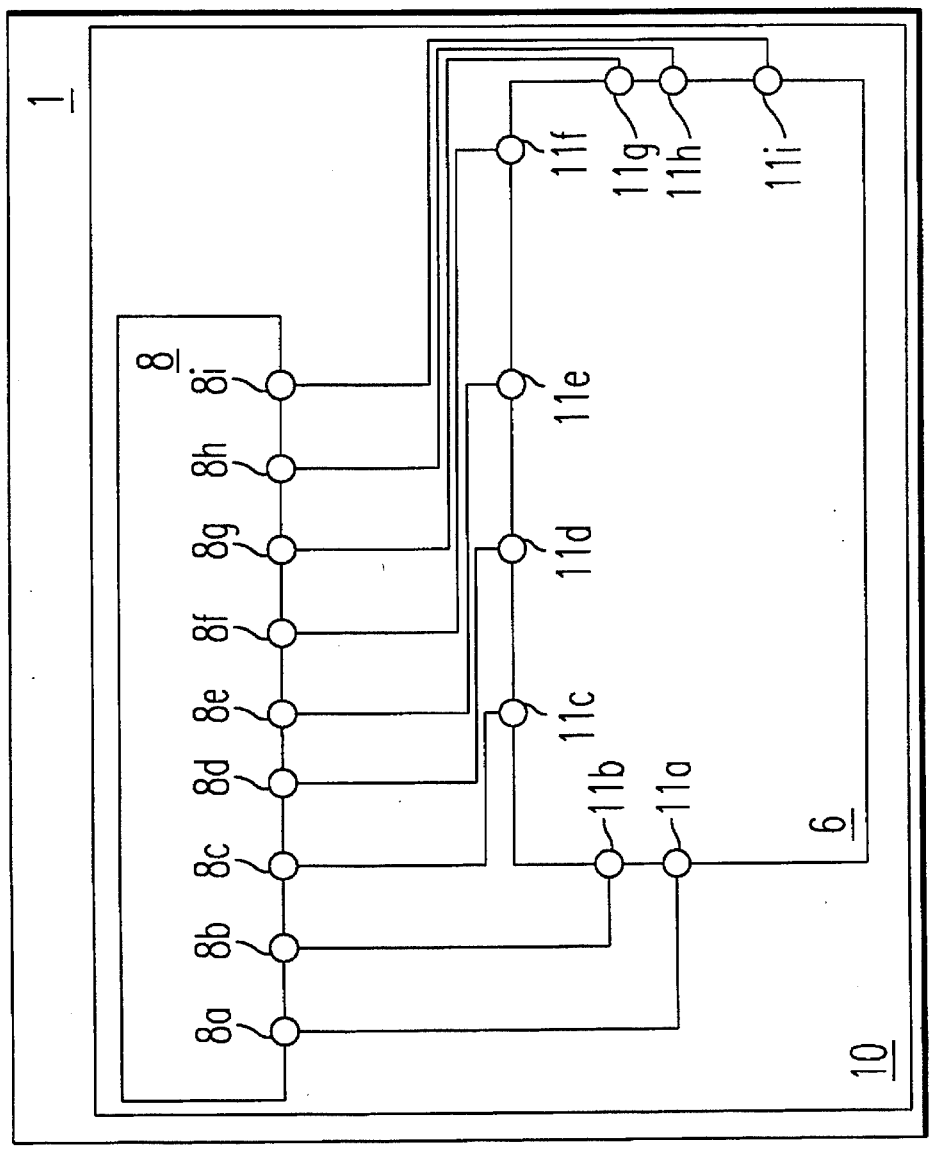

FIG. 43 illustrates the integrated circuit device I to which the conventional gate array design system is merely applied so as to provide a core circuit 10 including the bit slice circuit 6 and a memory circuit 8 for holding the control signal of the bit slice circuit 6. Input terminals 11a to 11i of the bit slice circuit 6 are connected to output terminals 8a to 8i of the memory circuit 8, respectively, and receive the control signal held in the memory circuit 8. The control signal controls the execution of the arithmetic operations in the bit slice circuit 6. In the core circuit 10, the memory circuit 8 and the bit slice circuit 6 are sometimes arranged in dispersed relation, resulting in an increased wiring length between the input terminals 11a to 11i and the output terminals 8a to 8i, a decreased degree of integration, and a prolonged delay time.

This creates the necessity of preventing the deterioration of the degree of integration and the delay time while the gate array design system is applied to the short-term development of the bit slice circuit. Thus the placement and routing of the present invention are determined in consideration for the position of the functional circuits.

According to the fundamental idea of the present invention, the functional circuits forming the bit slice circuit are arranged in units of a bit slice cell including the functional circuits for each path of propagation (that is, for each processing unit), and the bit slice circuit is formed, with the degree of integration and speeds optimized in the bit slice cells.

B. Preferred Embodiments of Structure of Bit Slice Circuit

(B-1) First preferred Embodiment

Figure 1:
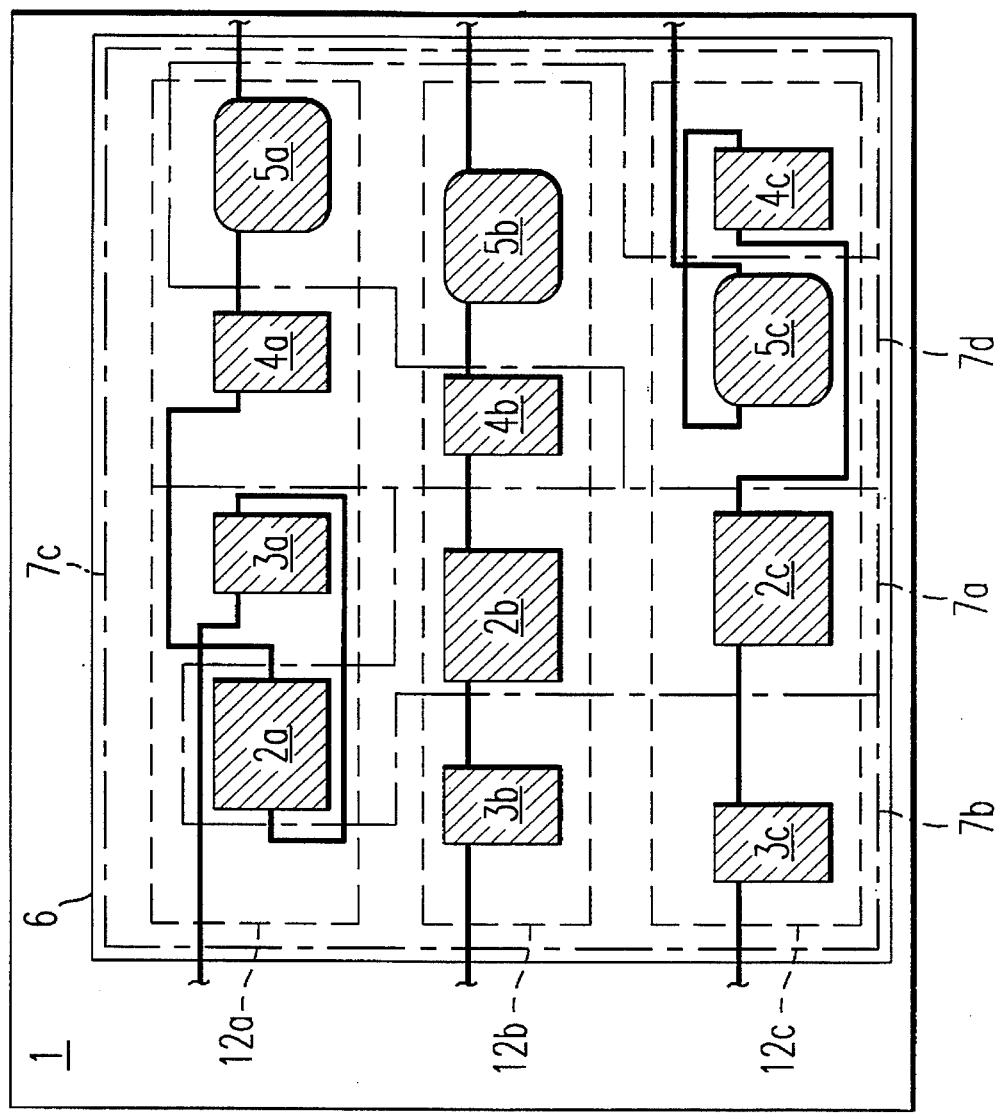
FIG. 1 is a block diagram illustrating a first preferred embodiment according to the present invention.

FIG. 1 is a block diagram of the bit slice circuit according to a first preferred embodiment of the present invention. The functional circuits for each path of propagation are arranged in a row to form a bit slice cell. For example, the register circuit 3a, arithmetic circuit 2a, register circuit 4a, and logic circuit 5a form a bit slice cell 12a corresponding to a path of propagation which connects the circuits 3a, 2a, 4a, 5a in this order. Similarly, the arithmetic circuit 2b, register circuits 3b, 4b and logic circuit 5b form a bit slice cell 12b, and the arithmetic circuit 2c, register circuits 3c, 4c, and logic circuit 5c form a bit slice cell 12c. The bit slice cells 12a to 12c are arranged in one direction.

Although the bit slice cells for three bits are shown in FIG. 1, more bit slice cells may be formed to achieve desired functions.

The bit slice circuit may be formed with the bit slice cells as units in this manner and the functional circuits are arranged for each bit slice cell, to thereby increase the degree of integration and make the operational speeds uniform. The execution of placement and routing affords the increased degree of integration and uniform operational speeds throughout the bit slice circuit. Thus the application of the gate array design system to the bit slice circuit does not deteriorate the performances but permits the short-term development of the bit slice circuit. For which bit operation the functional circuits are to be used or in which bit slice cell the functional circuits are to be placed is not sometimes specified for the reason of the structure of the functional circuit blocks. The first preferred embodiment may be applied to such functional circuits by placing them in any bit slice cell after the bit slice circuit is formed with the bit slice cells as units.

(B-2) Second Preferred Embodiment

Figure 2:
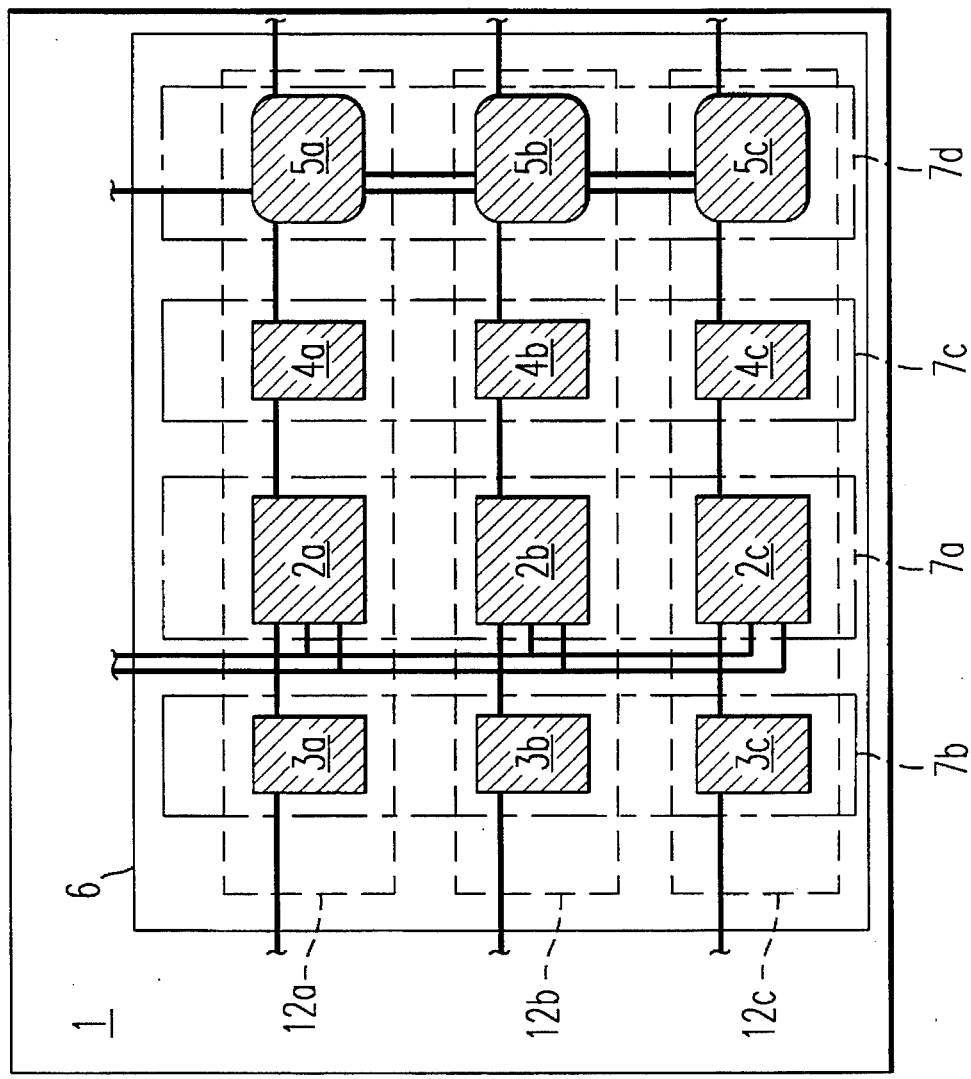
FIG. 2 is a block diagram illustrating a second preferred embodiment according to the present invention.

FIG. 2 is a block diagram of the bit slice circuit according to a second preferred embodiment of the present invention. The functional circuits for each path of propagation are arranged in a row to form the bit slice cells 12a to 12c in the same fashion as the first preferred embodiment. The placement and routing positions of the functional circuits in the bit slice cells 12a to 12c are uniformed over the bit slice cells.

For example, the functional circuit block 7a includes the arithmetic circuits 2a to 2c having the same function of arithmetic processing and is arranged generally orthogonal to the bit slice cells 12a to 12c. Accordingly the arithmetic circuits 2a to 2c are wired generally in a line across different bit slice cells. Likewise, the functional circuit block 7b including the register circuits 3a to 3c having the same function of data holding, the functional circuit block 7c including the register circuits 4a to 4c, and the functional circuit block 7d including the logic circuits 5a to 5c having the same function of data logical processing are placed generally orthogonal to the bit slice cells 12a to 12c.

In the bit slice circuit wherein the placement and routing positions of the functional circuits are uniformed over the bit slice cells, the wiring between the functional circuits having the same function, that is, the wiring for each functional circuit block is simplified generally in line form. This increases the degree of integration of the functional circuit blocks and, accordingly, increases the degree of integration of the bit slice circuit.

(B-3) Third preferred Embodiment

Figure 3:
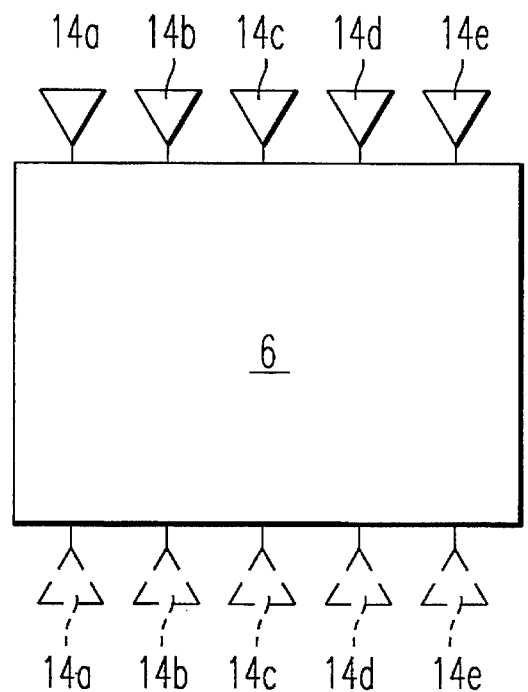
FIGS. 3 to 5 are block diagrams illustrating a third preferred embodiment according to the present invention.

FIG. 3 is a block diagram illustrating a third preferred embodiment according to the present invention. Clock drivers 14a to 14c used for clock signals required to operate the bit slice circuit 6 are provided around an outer periphery of the bit slice circuit 6.

The provision of the clock drivers 14a to 14e outside the bit slice circuit 6 increases the degree of integration of an inside region of the bit slice circuit 6. The clock drivers 14a to 14c may be provided on the underside of the outer periphery of the bit slice circuit 6 as indicated by the broken lines of FIG. 3.

Figure 4:
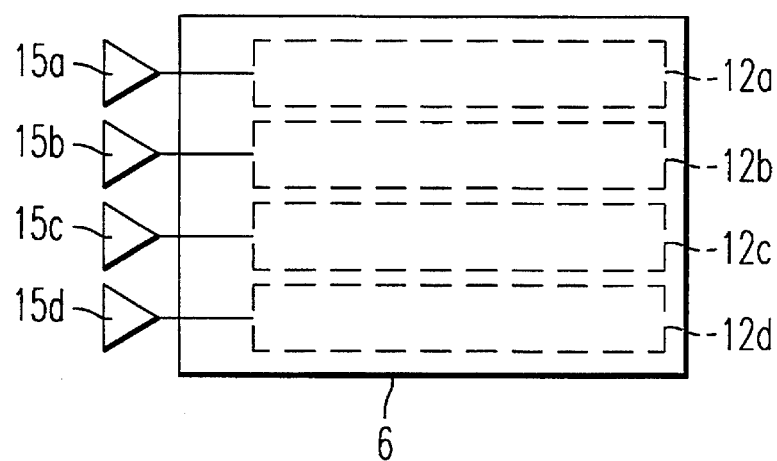

Referring to FIG. 4, the third preferred embodiment is applicable to clock drivers 15a to 15d required for the clock signals used in the bit slice cells to 12d, respectively. In this case, the degree of integration inside the respective bit slice cells is increased.

Figure 5:
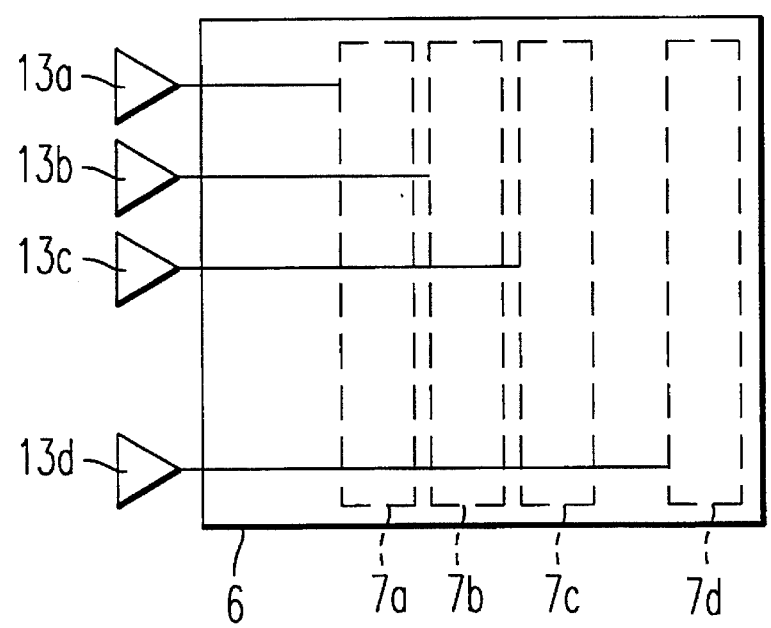

Referring to FIG. 5, the third preferred embodiment is applicable to clock drivers 13a to 13d required for the clock signals used in the functional circuit blocks 7a to 7d, respectively. In this case, the degree of integration of the respective functional circuit blocks is increased.

Thus the third preferred embodiment increases the degree of integration of the bit slice circuit.

(B-4) Fourth preferred Embodiment

In the first and second preferred embodiments, one bit slice cell is placed in one row in the bit slice circuit 6. One bit slice cell may be divided into two to be placed in two rows.

Figure 6:
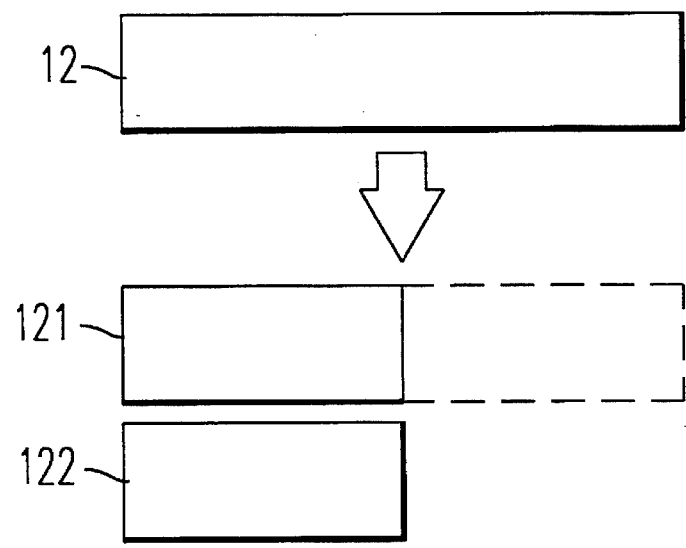
FIG. 6 is a block diagram illustrating a fourth preferred embodiment according to the present invention.

FIG. 6 conceptually illustrates the bit slice cell of the bit slice circuit according to a fourth preferred embodiment of the present invention. An undivided bit slice cell 12 is placed in one row. The bit slice cell 12 is suitably divided into half bit slice cells 121, 122 arranged vertically. The bit slice cell for one bit is placed in two rows, permitting the configuration of the bit slice circuit region to have the degree of freedom.

Consequently, the configuration of the bit slice circuit 6 also has the degree of freedom. Thus the bit slice circuit 6 is well aligned with circuits placed in regions other than the region of the bit slice circuit 6 when the integrated circuit 1 is designed, thereby reducing the redundancy of the circuit and increasing the degree of integration.

(B-5) Laying of Drive Link Used for Driving Functional Circuits

The following modes are applicable for laying a drive line required to drive the functional circuits 2a–2c, 3a–3c, 4a–4c, 5a–5c in the bit slice circuit 6 of the first to fourth preferred embodiments.

Figure 7:
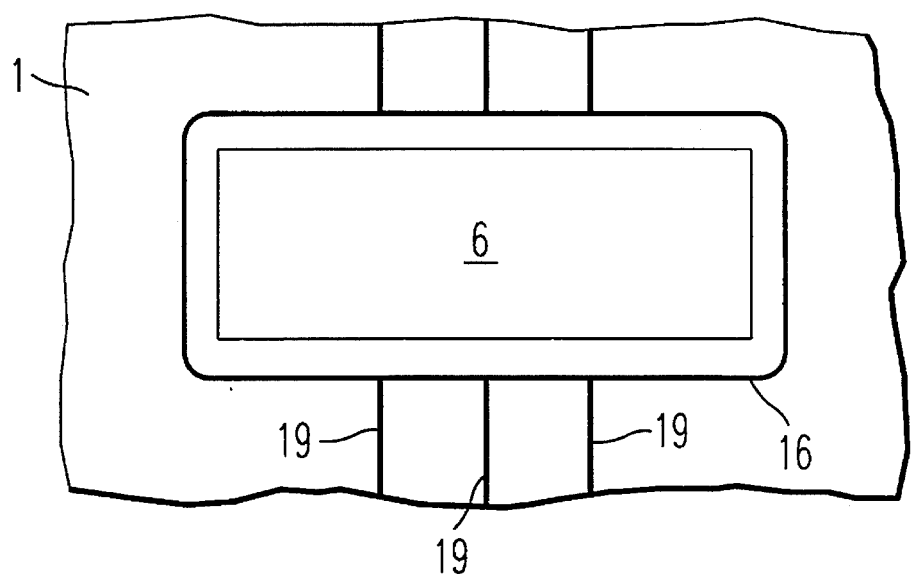
FIGS. 7 to 9 conceptually illustrate power supply lines applied to the first to fourth preferred embodiments.
Figure 8:
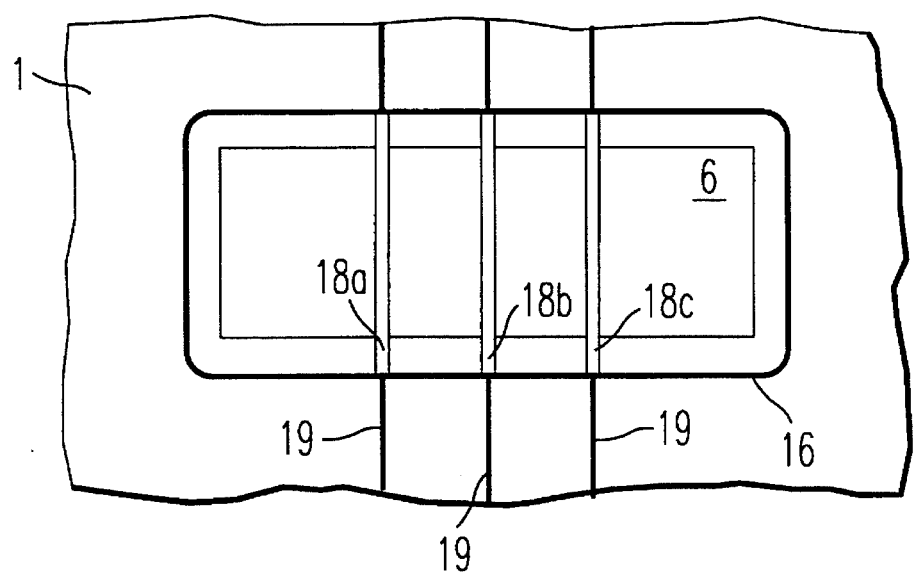
Figure 9:
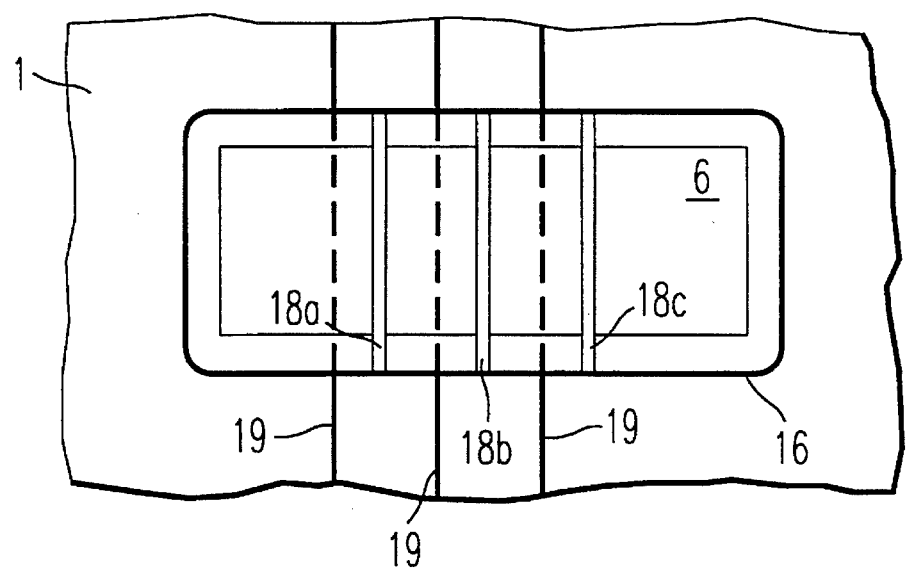

FIGS. 7 to 9 conceptually illustrate a mode of laying the drive line which is a power supply line 16 for supplying electric power required to drive the functional circuits.

Referring to FIG. 7, the power supply line 16 may be laid in ring-like form around a region in which the bit slice circuit 6 is to be placed. Such arrangement affords increase in degree of integration in the bit slice circuit 6 and stable supply of electric power, thereby achieving stable operation of the bit slice circuit 6 and, accordingly, higher operational speeds.

For supplying the power source to the functional circuits in the bit slice circuit 6, power source trunk lines connected to the power supply line 16 may be laid in the bit slice circuit 6.

FIG. 8 shows power source trunk lines 18a to 18c laid in aligned relation with power supply line positions 19 specified by the master of the gate array. FIG. 9 shows the power source trunk lines 18a to 18c laid in misaligned relation with the power supply line positions 19 specified by the master of the gate array. The power source trunk lines 18a to 18c for supplying the electric power required to drive the functional circuits in the bit slice circuit 6 are laid independently of the power supply line positions 19 specified by the master of the gate array, to thereby enable stable supply of electric power without decreasing the degree of integration of the inside region of the bit slice circuit 6. This accomplishes stable operation of the bit slice circuit 6 and, accordingly, higher operational speeds.

Figure 10:
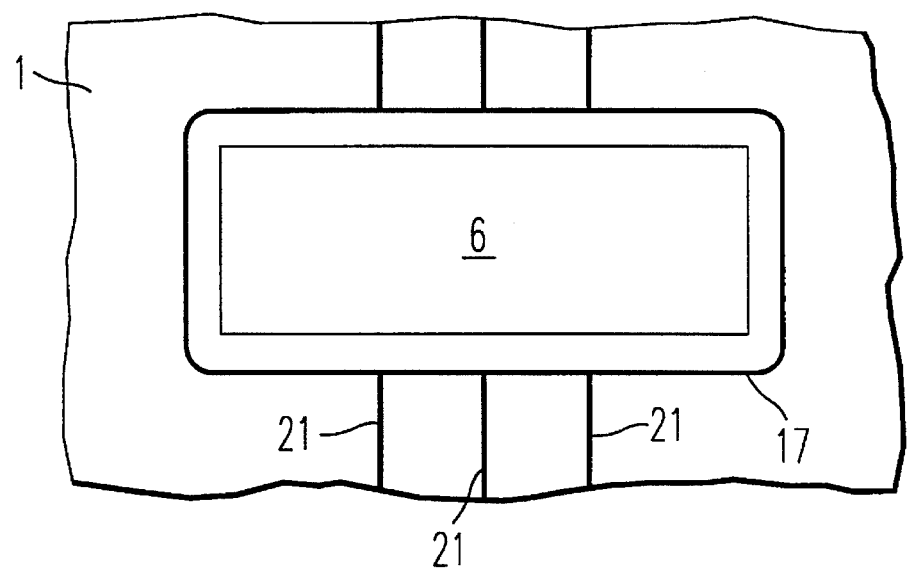
FIGS. 10 to 12 conceptually illustrate clock lines applied to the first to fourth preferred embodiments.
Figure 11:
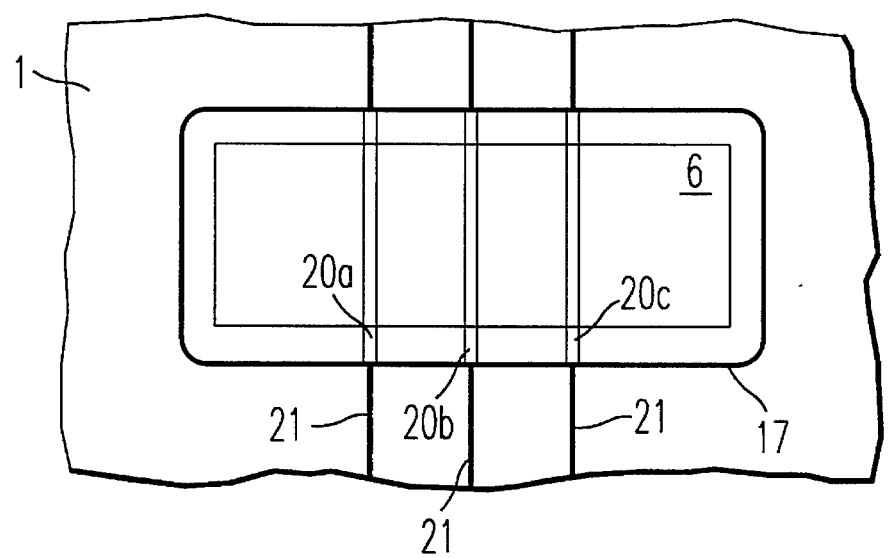
Figure 12:
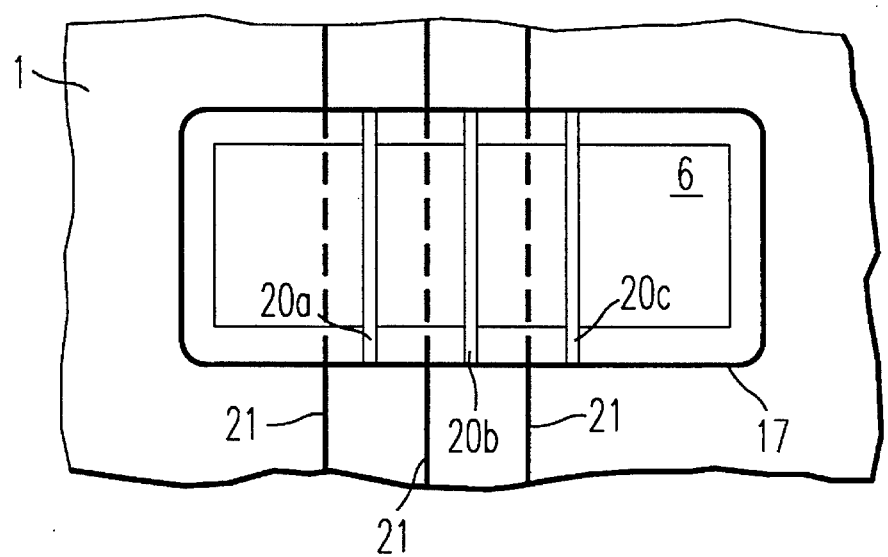

FIGS. 10 to 12 conceptually illustrate a mode of laying the drive line which is a clock line 17 for supplying clock signals required to drive the functional circuits.

Referring to FIG. 10, the clock line 17 may be laid in ring-like form around the region in which the bit slice circuit 6 is to be placed. Such arrangement affords increase in degree of integration in the bit slice circuit 6 and stable supply of clock signals, thereby achieving stable operation of the bit slice circuit 6 and, accordingly, higher operational speeds.

For supplying the clock signals to the functional circuits in the bit slice circuit 6, clock trunk lines connected to the clock line 17 may be laid in the bit slice circuit 6.

FIG. 11 shows clock trunk lines 20a to 20c laid in aligned relation with clock line positions 21 specified by the master of the gate array. FIG. 12 shows the clock trunk lines 20a to 20c laid in misaligned relation with the clock line positions 21 specified by the master of the gate array. The clock trunk lines 20a to 20c for supplying the clock signals required to drive the functional circuits in the bit slice circuit 6 are laid independently of the clock line positions 21 specified by the master of the gate array, to thereby enable stable supply of clock signals without decreasing the degree of integration of the inside region of the bit slice circuit 6. This accomplishes stable operation of the bit slice circuit 6 and, accordingly, higher operational speeds.

(B-6) Fifth Preferred Embodiment

Figure 13:
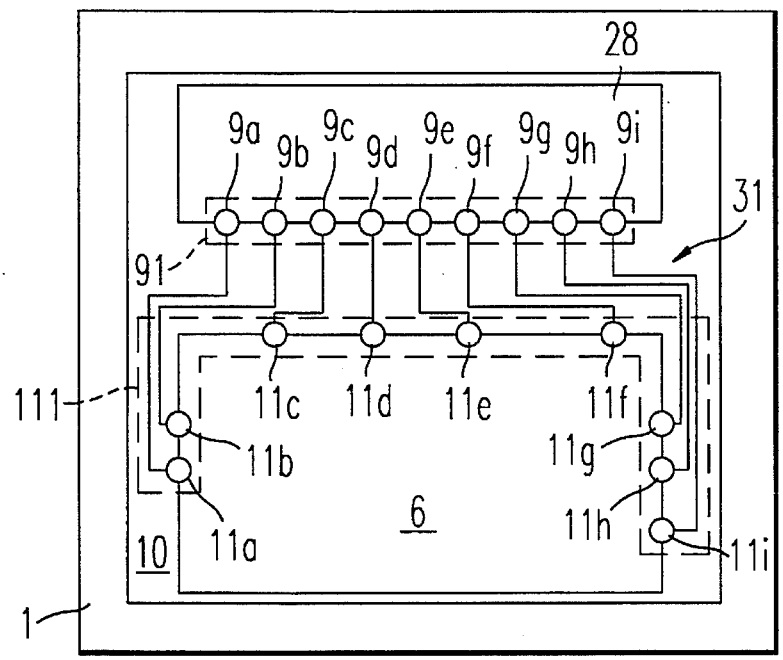
FIGS. 13 to 15 are block diagrams illustrating a fifth preferred embodiment according to the present invention.
Figure 14:
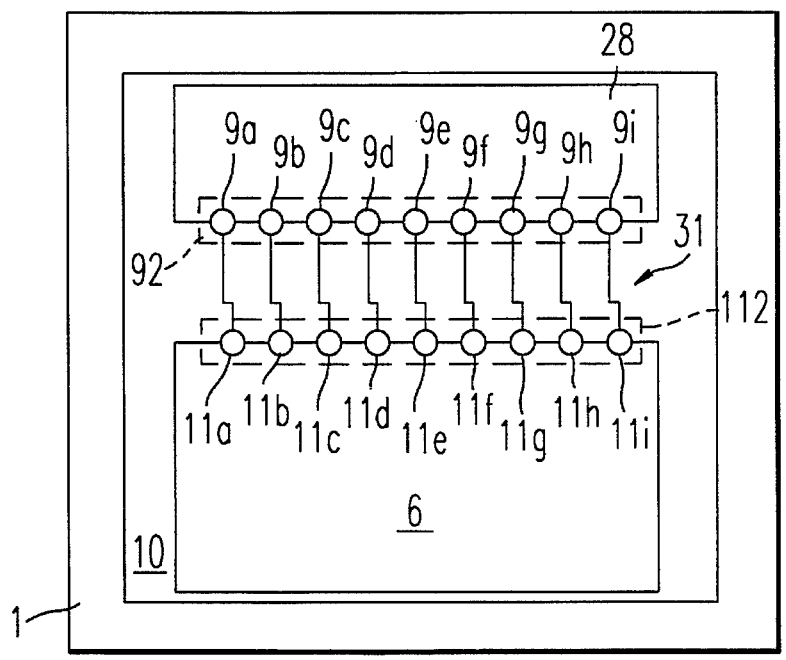
Figure 15:
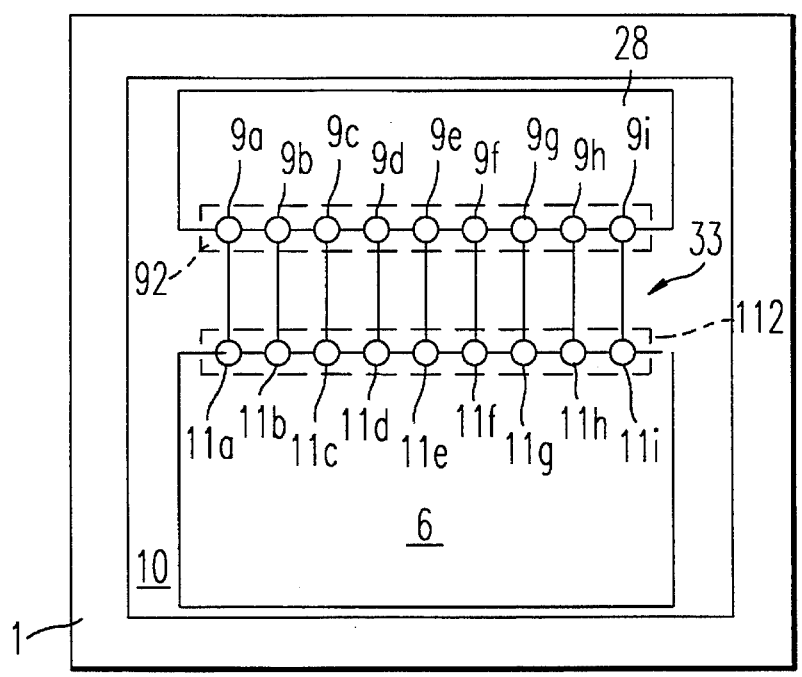

FIGS. 13 to 15 are block diagrams illustrating the core circuit 10 according to a fifth preferred embodiment of the present invention. The core circuit 10 includes a ROM 28 serving as a memory circuit and the bit slice circuit 6 and is provided in the integrated circuit device 1.

If long lines are provided for connection between the ROM 28 and the bit slice circuit 6, such effects are lost that the bit slice circuit 6 is constructed as shown in FIG. 2 and the routing is simplified for high-speed operation in the bit slice circuit 6. For this reason, the ROM 28 and the bit slice circuit 6 are arranged in the integrated circuit device I such that the lines for connecting the ROM 28 and the bit slice circuit 6 are minimized in the fifth preferred embodiment.

With reference to FIG. 13, the ROM 28 includes a terminal group 91 having the output terminals 9a to 9i, and the bit slice circuit 6 includes a terminal group 111 having the input terminals 11a to 11i. A line group 31 connects the output terminals 9a to 9i to the input terminals 11a to 11i, respectively.

The ROM 28 and the bit slice circuit 6 are arranged in such a manner that the total length of the lines of the line group 31 is minimized. Thus the high-speed operation of the bit slice circuit 6 is not remarkably lost by the connection to the ROM 28. That is, the delay time is enabled to be shortened. Further, the degree of integration of the core circuit 10 is increased.

The ROM 28 is shown as arranged above the bit slice circuit 6 in FIG. 13, however may be arranged therebelow as far as the lines of the line group 31 have a minimum total length.

Particularly, in the case where the ROM 28 includes a terminal group 92 having an array of the output terminals 9a to 9i arranged in one direction and the bit slice circuit 6 includes a terminal group 112 having an array of the input terminals 11a to 11i arranged in one direction, the terminal groups 92 and 112 are arranged in opposed relation, as shown in FIG. 14. This permits further reduction in the total length of the lines of a line group 32 for connecting the terminal groups 92 and 112 and enables the high-speed operation of the bit slice circuit 6 to contribute effectively to enhancement of speeds of the integrated circuit device 1.

The arrangement of the ROM 28 and the bit slice circuit 6 such that the input terminals and output terminals to be connected are opposed to each other, respectively, enables the total length of the lines of a line group 33 for connecting them to be further reduced preferably, as shown in FIG. 15.

The mode described in (B-5) may be applied to the laying of the power supply line for supplying electric power to the ROM 28 serving as the memory circuit.

Figure 16:
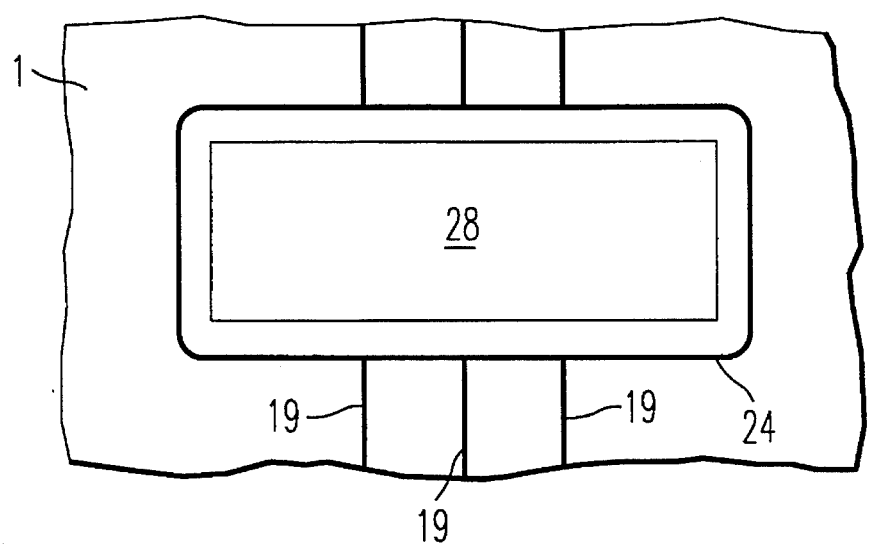
FIGS. 16 to 18 conceptually illustrate power supply lines applied to the fifth preferred embodiment.
Figure 17:
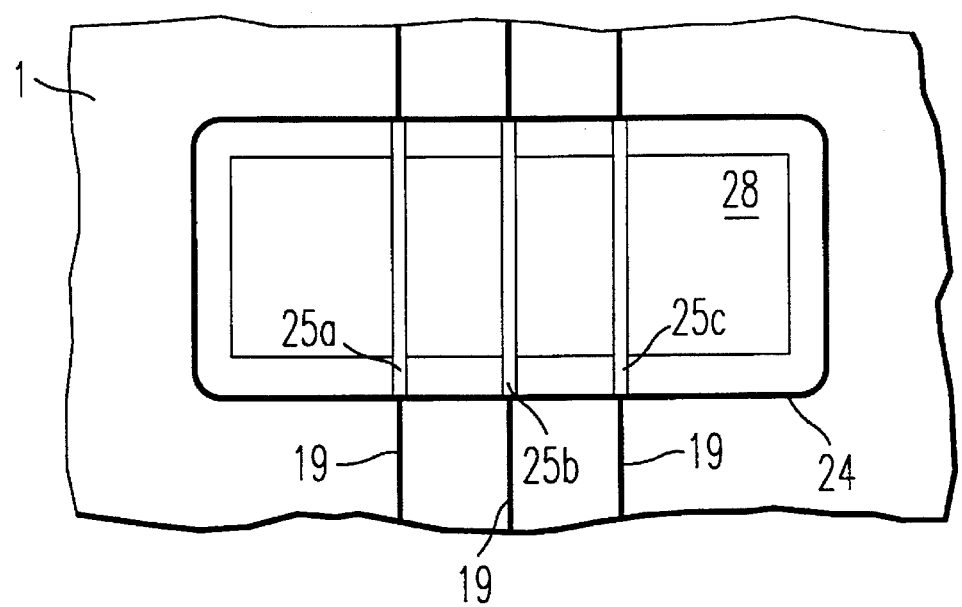
Figure 18:
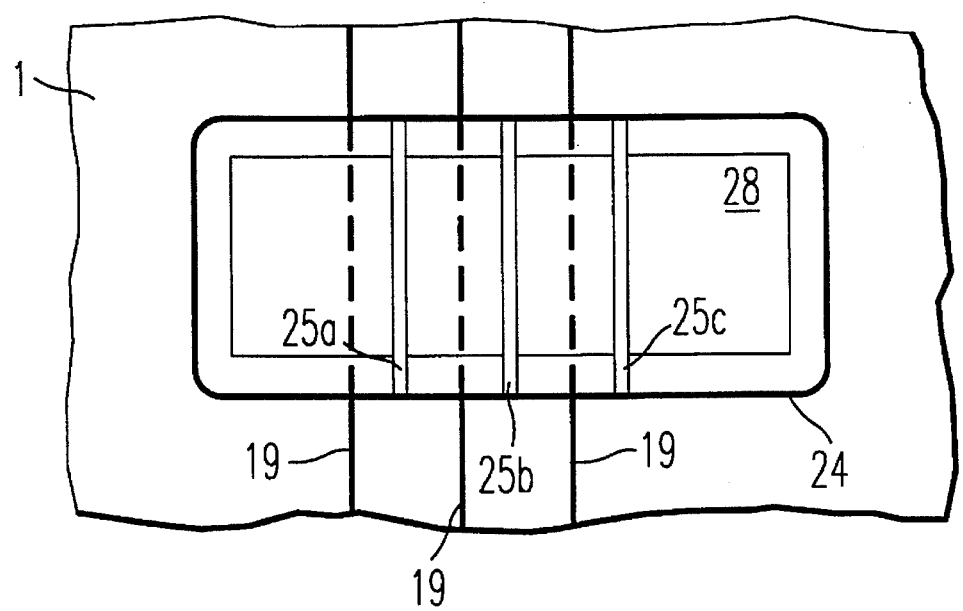

FIGS. 16 to 18 conceptually illustrate a mode of laying a power supply line 24 for supplying electric power to the ROM 28.

Referring to FIG. 16, the power supply line 24 may be laid in ring-like form around a region in which the ROM 28 is to be placed. Such arrangement affords increase in degree of integration in the ROM 28 and stable supply of electric power, thereby accomplishing stable operation of the ROM 28 and, accordingly, increased operational speeds.

For supplying the power source to the functional circuits in the ROM 28, power source trunk lines connected to the power supply line 24 may be laid in the ROM 28.

FIG. 17 shows power source trunk lines 25a to 25c laid in aligned relation with the power supply line positions 19 specified by the master of the gate array. FIG. 18 shows the power source trunk lines 25a to 25c laid in misaligned relation with the power supply line positions 19 specified by the master of the gate array. The power source trunk lines 25a to 25c for supplying the electric power required to drive the functional circuits in the ROM 28 are laid independently of the power supply line positions 19 specified by the master of the gate array, to thereby enable stable supply of electric power without decreasing the degree of integration of the inside region of the ROM 28. This achieves stable operation of the ROM 28 and, accordingly, increased operational speeds.

A PLA may be substituted for the ROM as the memory circuit.

Figure 19:
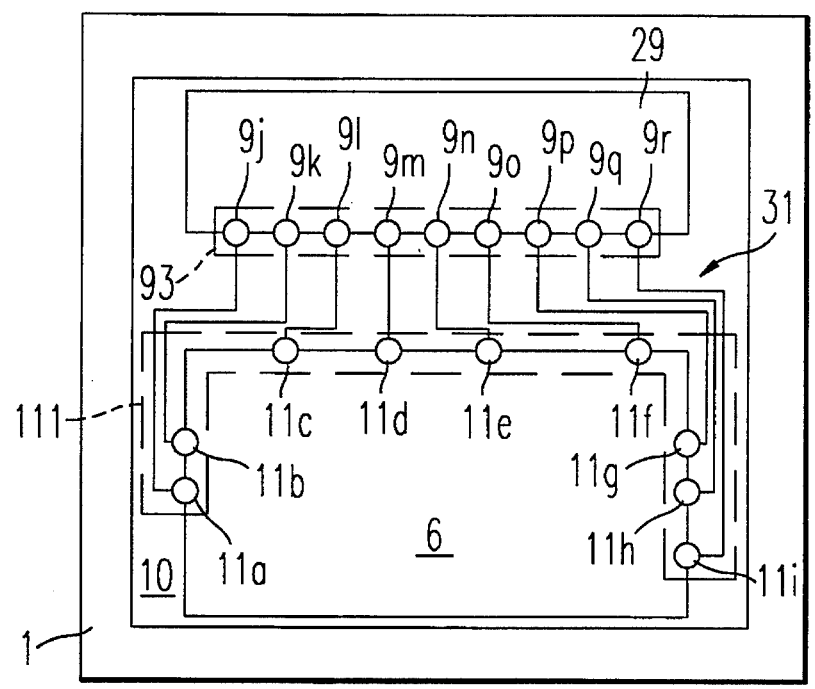
FIGS. 19 to 21 are block diagrams illustrating the fifth preferred embodiment.
Figure 20:
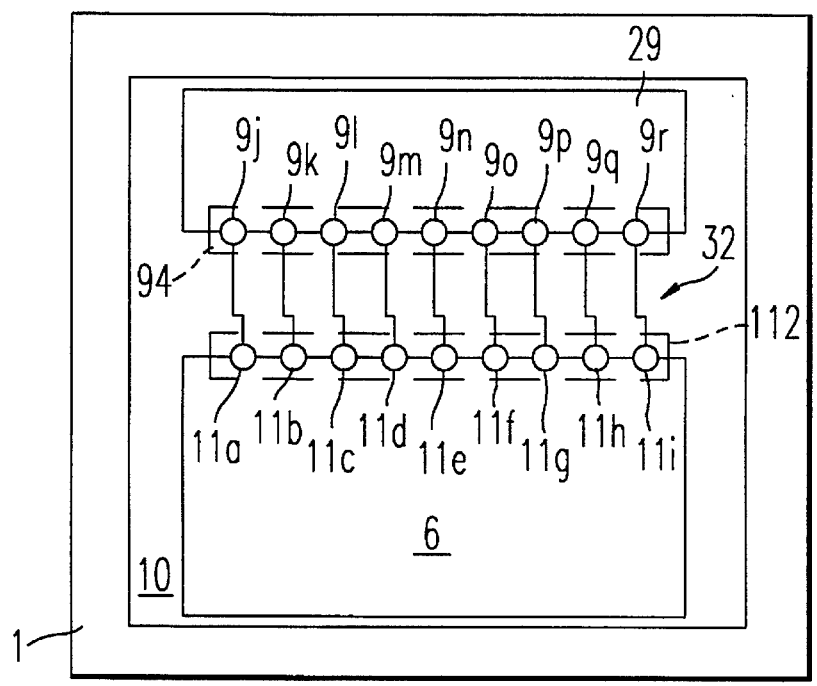
Figure 21:
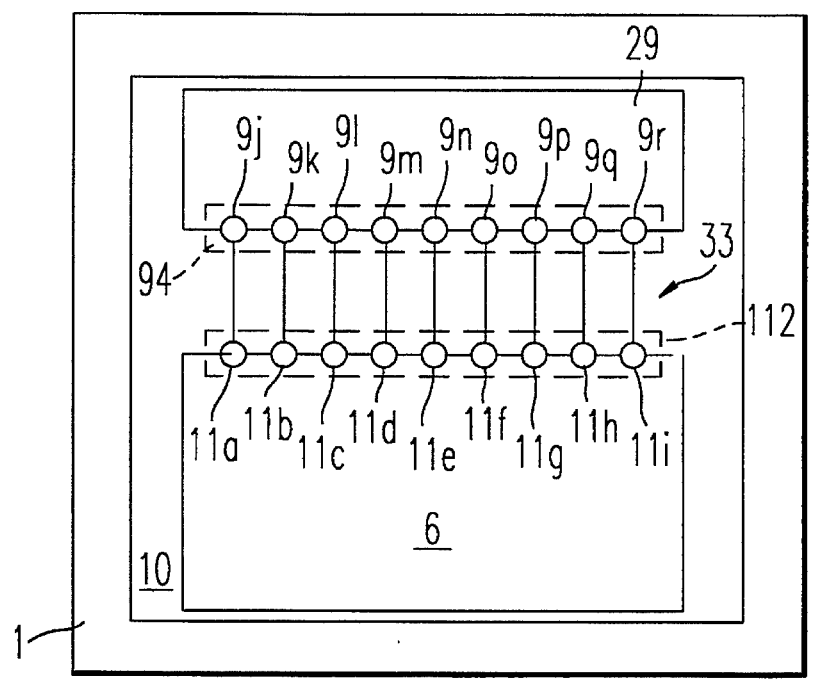

In FIGS. 19 to 21, the core circuit 10 includes a PLA 29 serving as the memory circuit and the bit slice circuit 6.

Referring to FIG. 19 corresponding to FIG. 13, the PLA 29 includes a terminal group 93 having output terminals 9j to 9r and the bit slice circuit 6 includes the terminal group 111 having the input terminals 11a to 11i. The line group 31 connects the output terminals 9j to 9r to the input terminals 11a to 11i, respectively.

The PLA 29 and the bit slice circuit 6 are arranged in such a manner that the total length of the lines of the line group 31 is minimized. Thus the high-speed operation of the bit slice circuit 6 is not greatly lost by the connection to the PLA 29. The PLA 29 is shown as arranged above the bit slice circuit 6 in FIG. 19, however may be arranged therebelow as far as the lines of the line group 31 have a minimum total length.

In particular, as shown in FIG. 20, in the case where the PLA 29 includes a terminal group 94 having an array of the output terminals 9j to 9r arranged in one direction and the bit slice circuit 6 includes the terminal group 112 having an array of the input terminals 11a to 11i arranged in one direction, the terminal groups 94 and 112 are opposed to each other in corresponding relation to FIG. 14. This permits further reduction in the total length of the lines of the line group 32 for connecting the terminal groups 94 and 112. Further, as shown in FIG. 21, the arrangement of the PLA 29 and the bit slice circuit 6 such that the input terminals and output terminals to be connected are opposed to each other, respectively, enables the total length of the lines of the line group 33 for connecting them to be further reduced preferably, similarly to the description in conjunction with FIG. 15.

The mode described in (B-5) may be applied to the laying of the power supply line for supplying electric power to the PLA 29 serving as the memory circuit.

Figure 22:
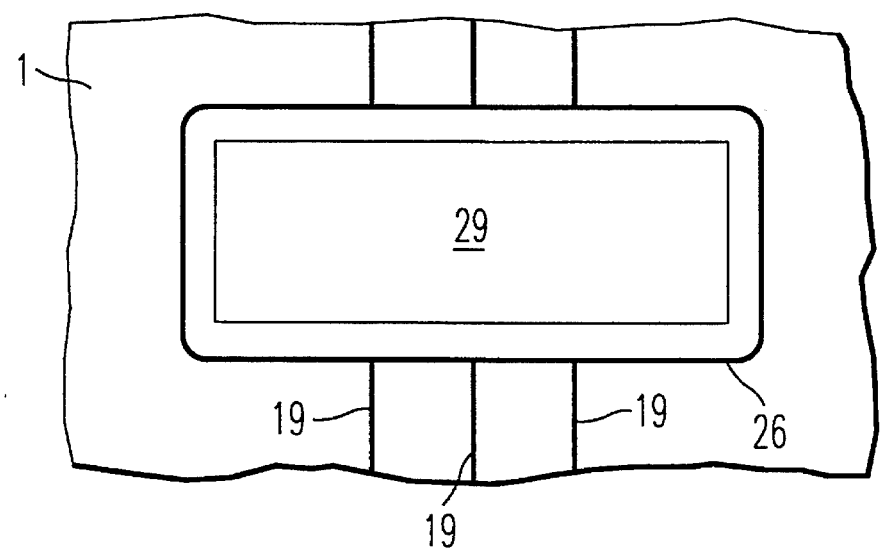
FIGS. 22 to 24 conceptually illustrate power supply lines applied to the fifth preferred embodiment.
Figure 23:
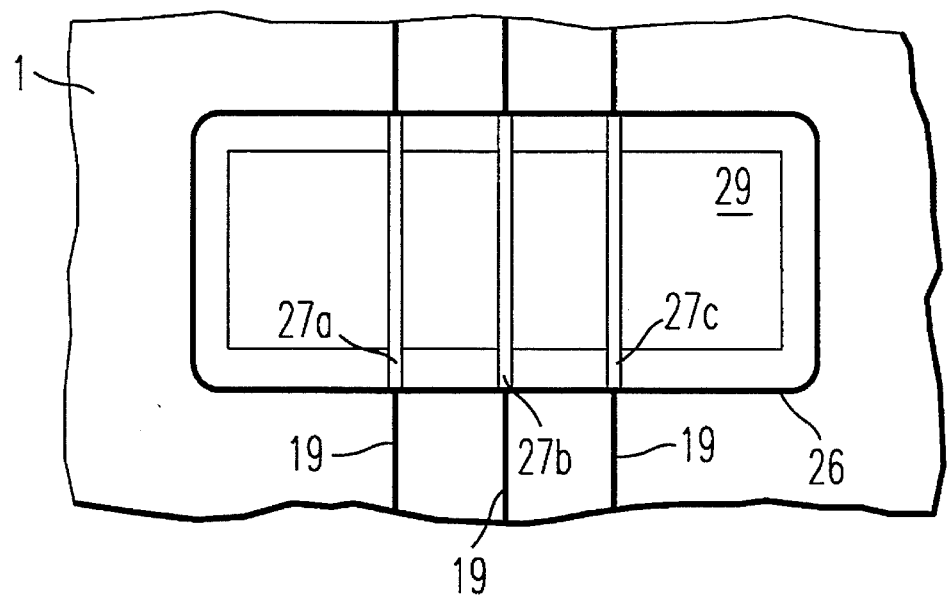
Figure 24:
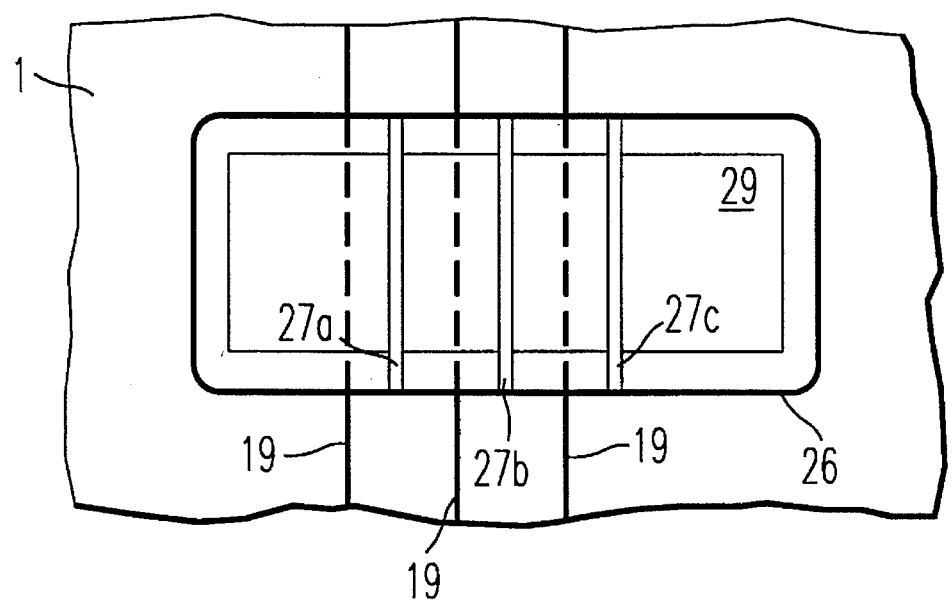

FIGS. 22 to 24 conceptually illustrates a mode of laying a power supply line 26 for supplying electric power to the PLA 29 in corresponding relation to FIGS. 7 to 9 or FIGS. 16 to 18.

Referring to FIG. 22, the power supply line 26 may be laid in ring-like form around a region in which the PLA 29 is to be placed. Power source trunk lines 27a to 27c connected to the power supply line 26 may be laid in the PLA 29, as shown in FIGS. 23 and 24.

FIG. 23 shows the power source trunk lines 27a to 27c laid in aligned relation with the power supply line positions 19 specified by the master of the gate array. FIG. 24 shows the power source tank lines 27a to 27c laid in misaligned relation with the power supply line positions 19 specified by the master of the gate array. Such arrangements afford stable supply of electric power without decreasing the degree of integration of the inside region of the PLA 29. This achieves stable operation of the PLA 29 and, accordingly, increased operational speeds.

C. Preferred Embodiments of Method of Designing Bit Slice Circuit

Description will now be given on a method of designing the bit slice circuit of the first to fifth preferred embodiments by means of a CAD system.

(C-1) Sixth Preferred Embodiment

Figure 25:
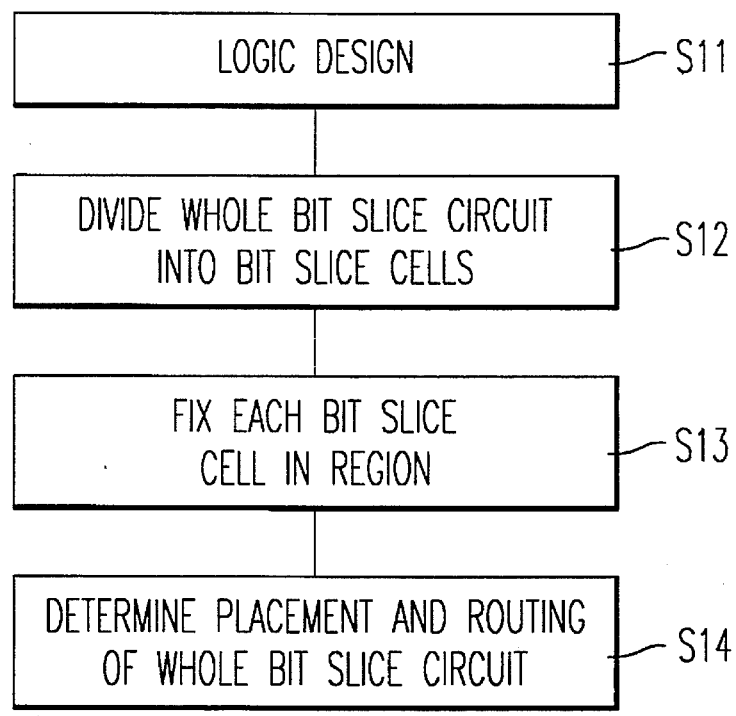
FIG. 25 is a flow chart illustrating a sixth preferred embodiment according to the present invention.
Figure 26:
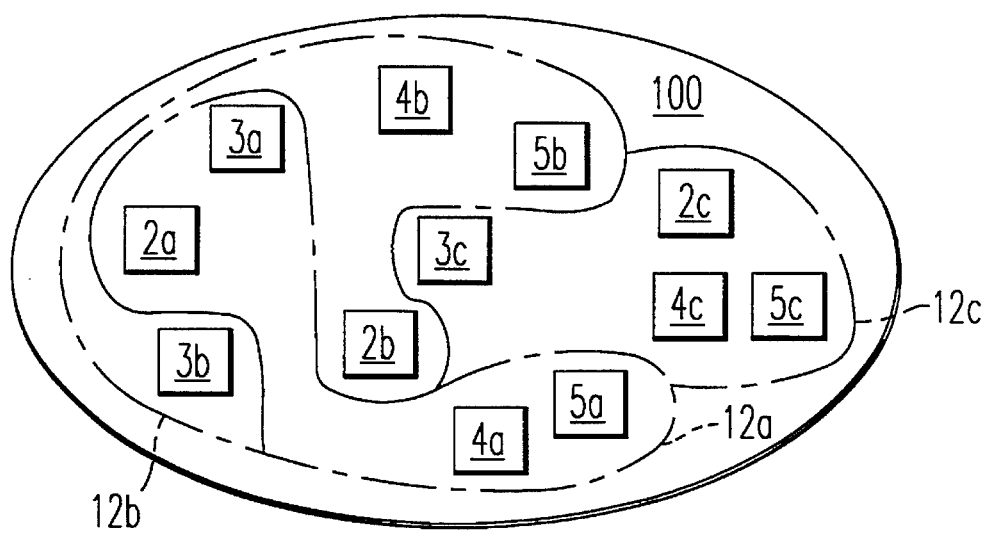
FIGS. 26 and 27 conceptually illustrate the sixth preferred embodiment.
Figure 27:
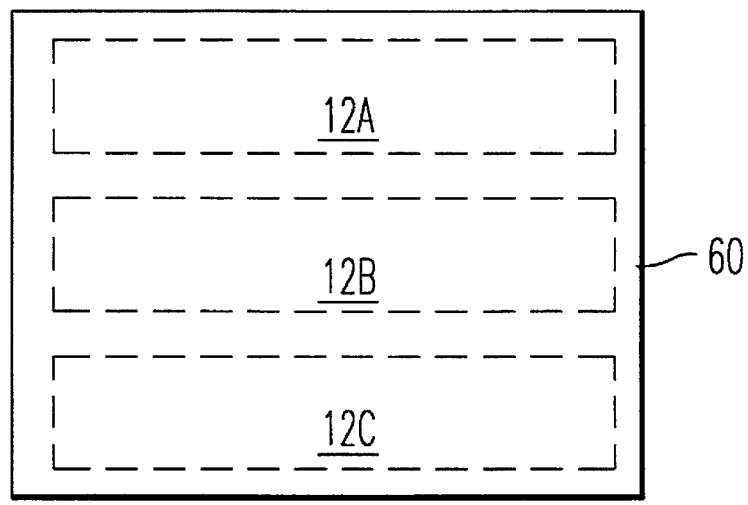

FIG. 25 is a flow chart illustrating the method of designing the bit slice circuit according to a sixth preferred embodiment of the present invention. FIGS. 26 and 27 conceptually illustrate the method of the sixth preferred embodiment.

In the step S11 is designed a logic required for the bit slice circuit to have a desired function. The whole bit slice circuit designed is divided into bit slice cells in the step S12. FIG. 26 shows a bit slice circuit 100 in the logic design stage. The bit slice circuit 100 in the logic design stage is divided into the bit slice cells 12a, 12b, 12c each including various functional circuits.

In the step S13, the placement of the bit slice circuit 100 in a region 60 where the bit slice circuit is to be formed is determined for the bit slice cells. FIG. 27 shows regions 12A, 12B, 12C in which the bit slice cells 12a, 12b, 12c are to be fixed respectively in the region 60.

In the step S14, the functional circuit blocks are placed in the bit slice cells 12a, 12b, 12c, and the whole line positions are determined, whereby the bit slice circuit 6 of the first or second preferred embodiment shown in FIG. 1 or 2 is designed. The sixth preferred embodiment is allowed to design the bit slice circuit of the first or second preferred embodiment by using the gate array design system and to reduce the development period. In addition, the bit slice cells are aligned, and the functional circuit is placed for each bit of the bit slice circuit, preventing the degree of integration, operational speeds, and speed uniformity from deteriorating.

(C-2) Seventh preferred Embodiment

Figure 28:
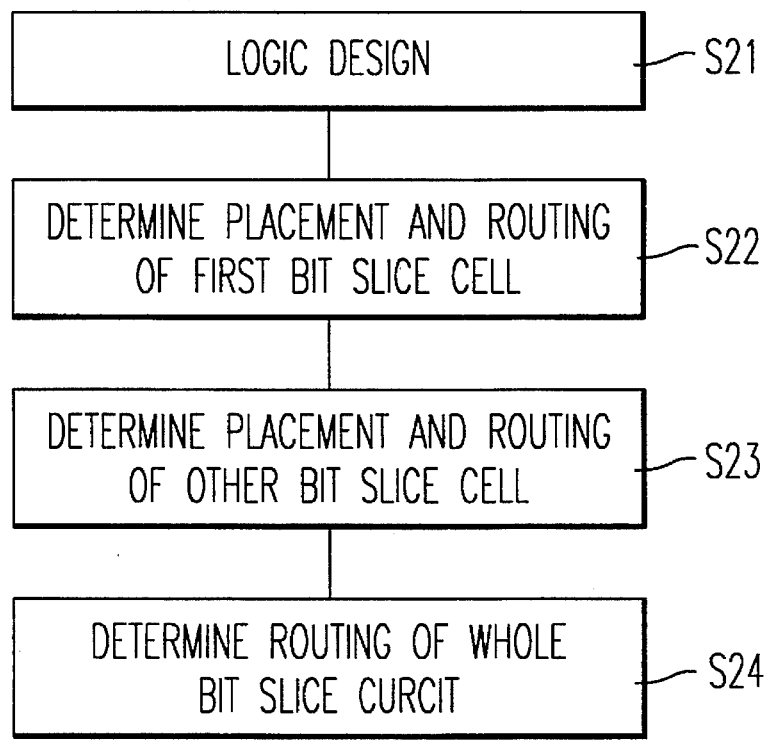
FIG. 28 is a flow chart illustrating a seventh preferred embodiment according to the present invention.
Figure 29:
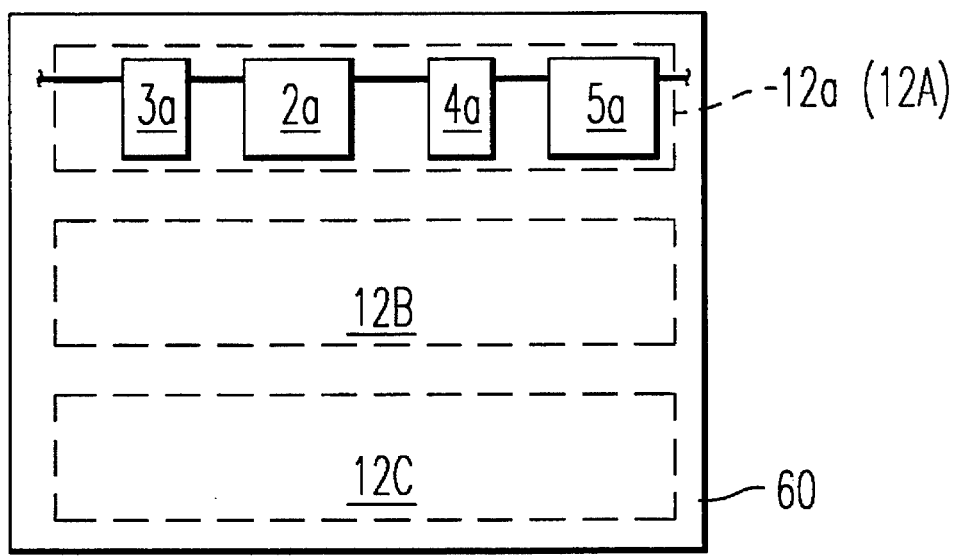
FIGS. 29 and 30 conceptually illustrate the seventh preferred embodiment.
Figure 30:
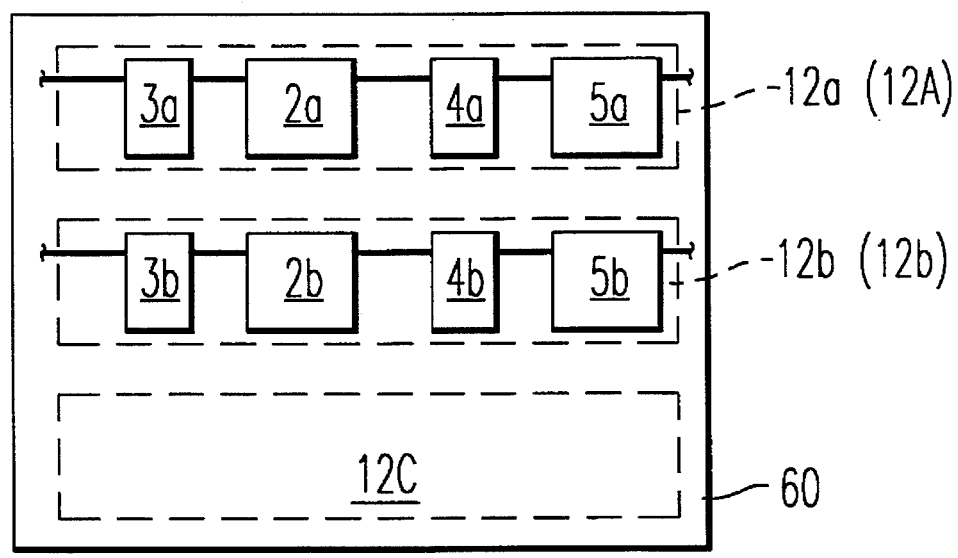

FIG. 28 is a flow chart illustrating the method of designing the bit slice circuit according to a seventh preferred embodiment of the present invention. FIGS. 29 and 30 conceptually illustrate the method of the seventh preferred embodiment.

In the step S21 is designed a logic required for the bit slice circuit to have a desired function, in the same manner as the sixth preferred embodiment. In the step S22, the placement and routing of a first bit slice cell is determined. FIG. 29 conceptually illustrates the step of completion of the placement and routing for the bit slice cell 12a.

In the step S23, the placement and routing of other bit slice cells are determined by using the placement and routing information of the bit slice cell 12a of the step S22. FIG. 30 Conceptually illustrates the step of completion of the placement and muting for the bit slice cell 12b. The functional circuits 3b, 2b, 4b, 5b are placed in alignment with the functional circuits 3a, 2a, 4a, 5a of the bit slice cell 12a. For the bit slice cell 12c, the functional circuits 3c, 2c, 4c, 5c can be placed in alignment with the functional circuits 3a, 2a, 4a, 5a of the bit slice cell 12a.

In the step S24, the muting of the whole bit slice circuit is determined, to thereby design the bit slice circuit 6 of the second preferred embodiment. In other words, the seventh preferred embodiment is allowed to design the bit slice circuit of the second preferred embodiment by using the gate array design system and to reduce the development period. In the same fashion as the sixth preferred embodiment, the functional circuit is placed for each bit of the bit slice circuit, preventing the degree of integration, operational speeds, and speed uniformity from deteriorating.

(C-3) Eighth Preferred Embodiment

Figure 31:
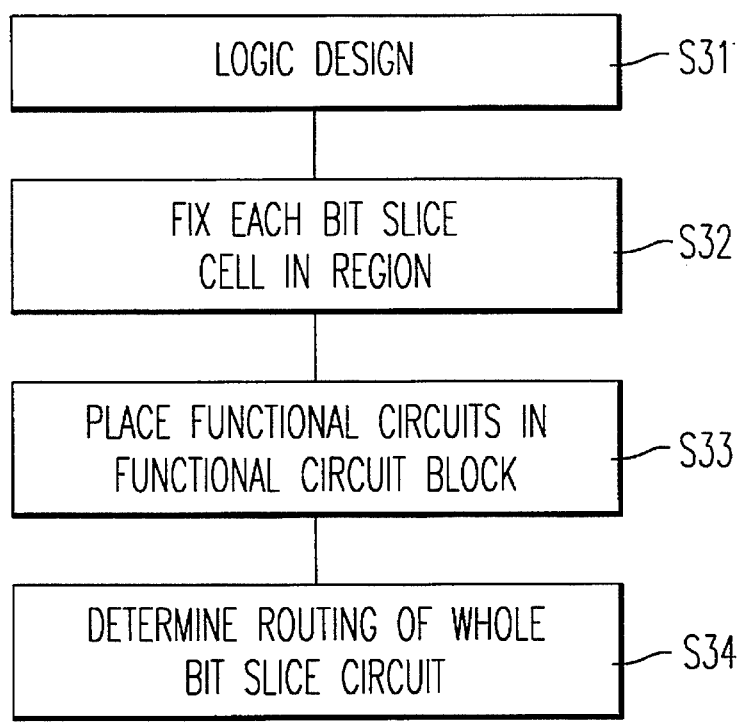
FIG. 31 is a flow chart illustrating an eighth preferred embodiment according to the present invention.
Figure 32:
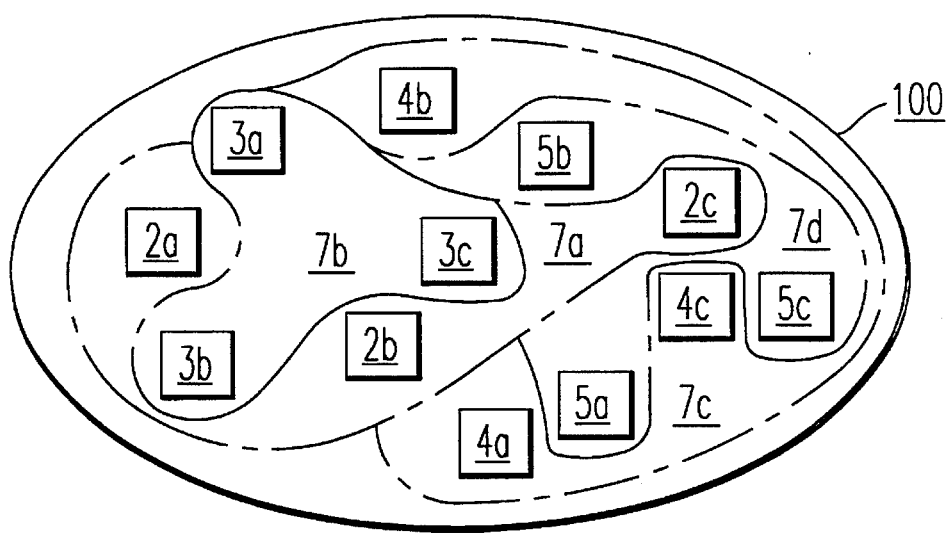
FIGS. 32 to 34 conceptually illustrate the eighth preferred embodiment.
Figure 33:
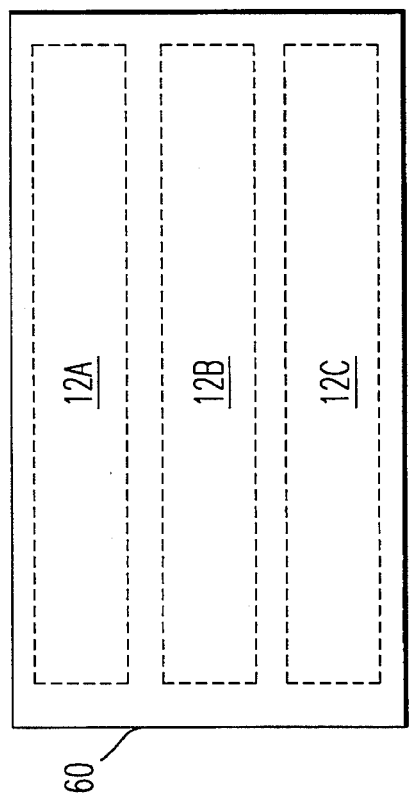
Figure 34:
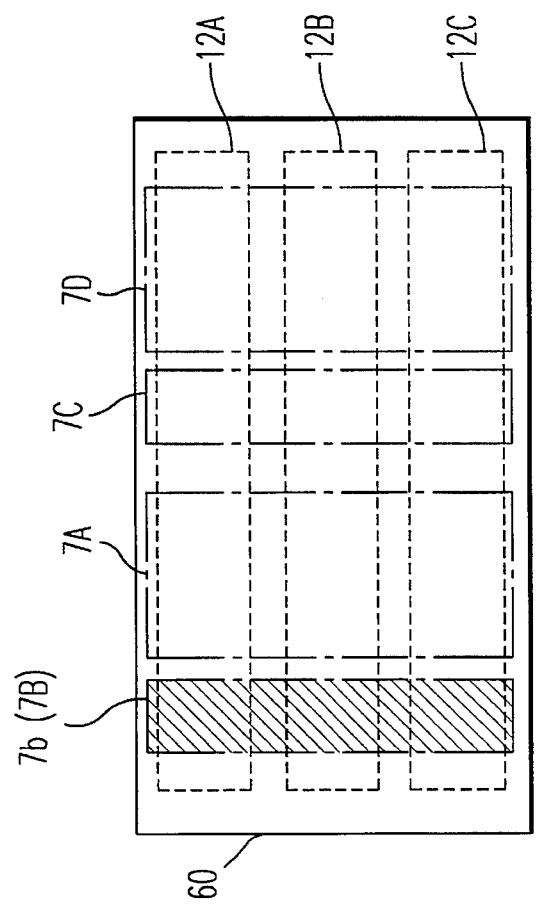

FIG. 31 is a flow chart illustrating the method of designing the bit slice circuit according to an eighth preferred embodiment of the present invention. FIGS. 32 to 34 conceptually illustrate the method of the eighth preferred embodiment.

In the step S31 is designed a logic required for the bit slice circuit to have a desired function, in the same manner as the sixth preferred embodiment. FIG. 32 illustrates the bit slice circuit 100 in the logic design stage. The bit slice circuit 100 in the logic design stage is divided into functional circuit blocks 7a, 7b, 7c, 7d each including the functional circuits of the same type.

In the step S32, the placement of the bit slice circuit 100 in the region 60 where the bit slice circuit is to be formed is determined for the bit slice cells. FIG. 33 illustrates the regions 12A, 12B, 12C in which the bit slice cells 12a, 12b, 12c are to be fixed respectively in the region 60.

The placement and routing of the bit slice circuit is determined for each functional circuit block in the step S33. FIG. 34 conceptually illustrates regions 7A, 7B, 7C, 7D where the functional circuit blocks 7a, 7b, 7c, 7d are to be placed respectively in the region 60. The functional circuit block 7b is shown as having just placed in the region 7B in FIG. 34.

The functional circuit blocks 7b, 7c, 7d are subsequently placed, and the routing of the whole bit slice circuit is determined in the step S34. This completes the design of the bit slice circuit 6.

The eighth preferred embodiment is allowed to provide the bit slice circuit 6 of the first or second preferred embodiment by using the gate array design system in accordance with the configuration of the regions 7A, 7B, 7C, 7D, and has the same effects as the sixth preferred embodiment.

(C-4) Ninth Preferred Embodiment

Figure 35:
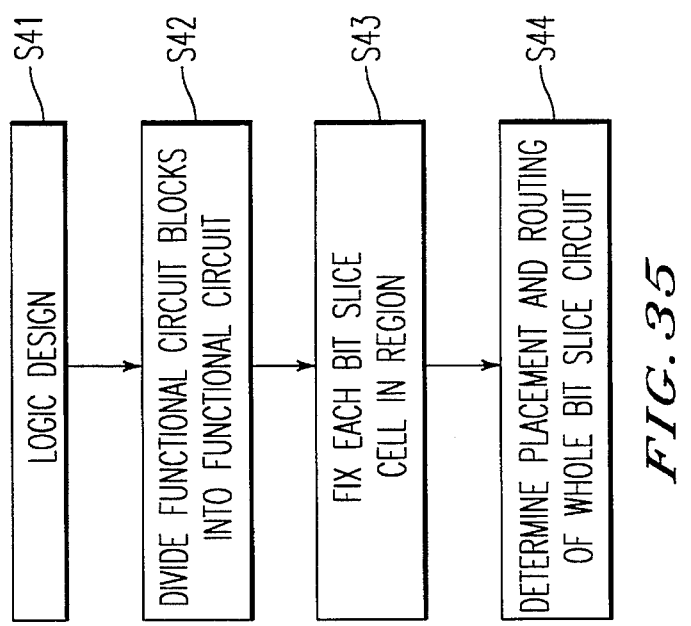
FIG. 35 is a flow chart illustrating a ninth preferred embodiment according to the present invention.
Figure 36:
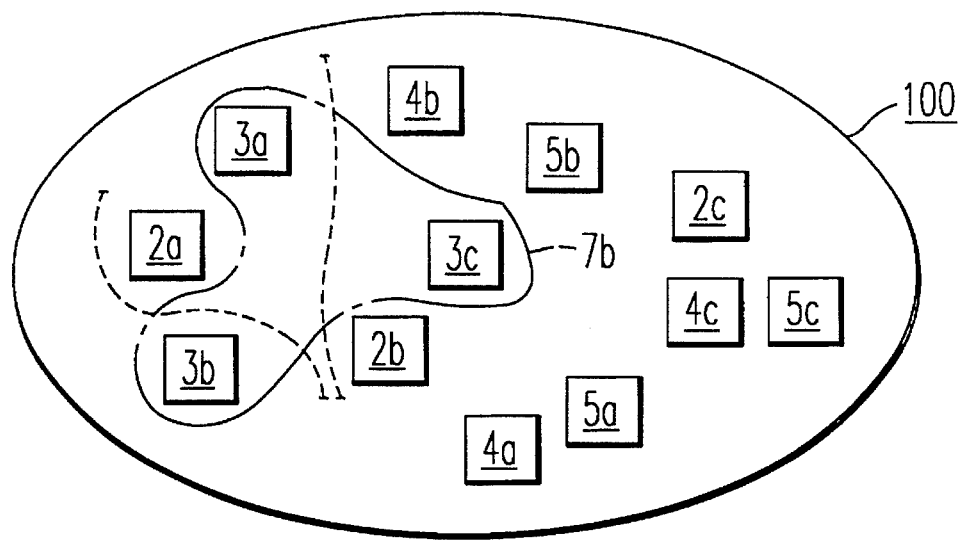
FIGS. 36 and 37 conceptually illustrate the ninth preferred embodiment.
Figure 37:
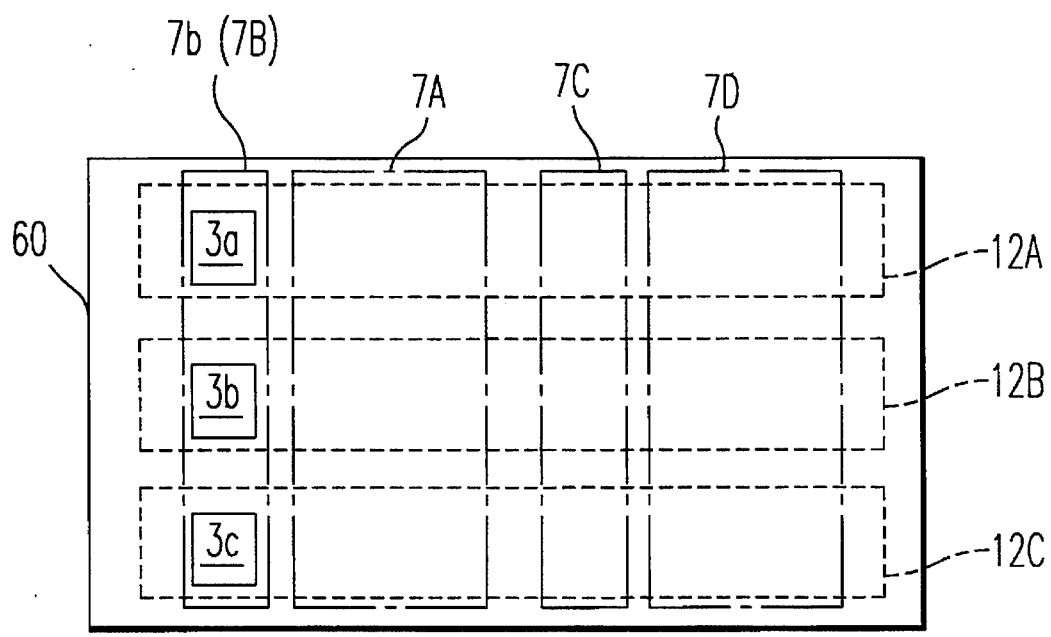

FIG. 35 is a flow chart illustrating the method of designing the bit slice circuit according to a ninth preferred embodiment of the present invention. FIGS. 36 and 37 conceptually illustrate the method of the ninth preferred embodiment.

In the step S41 is designed a logic required for the bit slice circuit to have a desired function, in the same manner as the sixth preferred embodiment. FIG. 36 shows the bit slice circuit 100 in the logic design stage. The bit slice circuit 100 in the logic design stage is divided into the functional circuit blocks 7a, 7b, 7c, 7d each including the functional circuits of the same type. The functional circuit blocks are divided into the functional circuits in corresponding relation to the bit slice cells in the step S42. The functional circuit block 7b is shown as divided into the register circuits 3a, 3b, 3c in FIG. 36.

In the step S43, the placement of the bit slice circuit 100 in the region 60 wherein the bit slice circuit is to be formed is fixed for the bit slice cells. FIG. 37 shows the regions 12A, 12B, 12C in which the bit slice cells 12a, 12b, 12c are to be fixed respectively in the region 60.

In the step S44, the divided functional circuits of the step S42 are placed in the regions 12A, 12B, 12C to determine the placement and routing of the whole bit slice circuit. The register circuits 3a, 3b, 3c are shown as placed in FIG. 37. The register circuits 3a, 3b, 3c are placed in the region 7B where the functional circuit block 7b is to be placed. Similarly, the functional circuits forming the functional circuit blocks 7a, 7c, 7d are placed in the regions 7A, 7C, 7D, respectively. The placement is performed for each functional circuit block.

The ninth preferred embodiment is allowed to design the bit slice circuit 6 of the first or second preferred embodiment by using the gate array design system in accordance with the configuration of the regions 7A, 7B, 7C, 7D, and has the same effects as the sixth preferred embodiment.

(C-5) Tenth Preferred Embodiment

Figure 39:
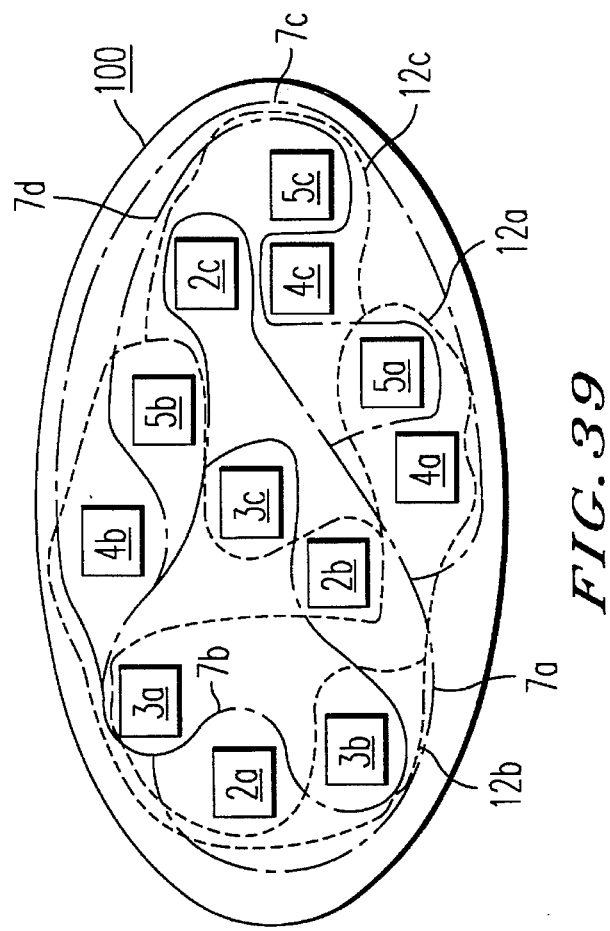
FIG. 39 conceptually illustrates the tenth preferred embodiment.
Figure 38:
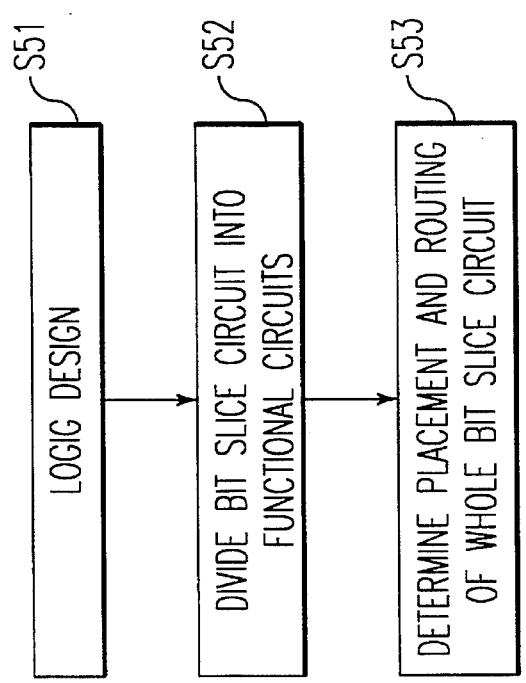
FIG. 38 is a flow chart illustrating a tenth preferred embodiment according to the present invention.

FIG. 38 is a flow chart illustrating the method of designing the bit slice circuit according to a tenth preferred embodiment of the present invention. FIG. 39 conceptually illustrates the method of the tenth preferred embodiment.

In the step S51 is designed a logic required for the bit slice circuit to have a desired function, in the same manner as the sixth preferred embodiment. In the step S52, the bit slice circuit in the logic design stage is divided into the functional circuits. FIG. 39 shows the bit slice circuit 100 in the logic design stage divided into the functional circuits. The bit slice circuit 100 is first divided into the functional circuit blocks 7a, 7b, 7c, 7d each of which is then divided for each bit into bit cells 12a, 12b, 12c.

In the step S53, the functional circuit blocks are placed in predetermined regions, and the routing is determined, to thereby determine the placement and routing of the whole bit slice circuit. As a result, the tenth preferred embodiment enables the bit slice circuit 6 of the first or second preferred embodiment to be designed using the gate array design system and has the same effects as the sixth preferred embodiment.

(C-6) Eleventh Preferred Embodiment

Figure 40:
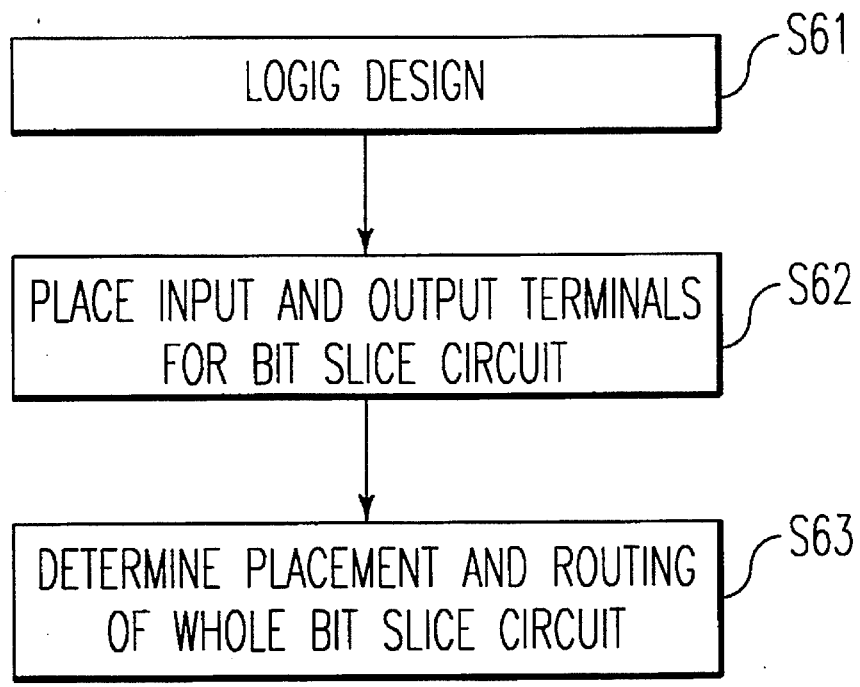
FIG. 40 is a flow chart illustrating an eleventh preferred embodiment according to the present invention.

FIG. 40 is a flow chart illustrating the method of designing the bit slice circuit according to an eleventh preferred embodiment of the present invention.

In the step S61 is designed a logic required for the bit slice circuit to have a desired function, in the same manner as the sixth preferred embodiment. Prior to the placement of the bit slice circuit, input and output terminals for use in the bit slice circuit are placed in the step S62. The placement and routing of the bit slice circuit is then determined in the step S63. Such a flow enables the functional circuits to be placed in consideration for the position of the placed input and output terminals, whereby the bit slice circuit 6 as shown in FIGS. 14, 15, 20, 21 is designed in the fifth preferred embodiment.

While the invention has been shown and described in detail, the foregoing description is in all aspects illustrative and not restrictive. It is therefore understood that numerous modifications and variations can be devised without departing from the scope of the invention.

What is claimed is:

1. An integrated circuit device comprising:

a plurality of bit slice cells, each of said bit cells including at least one functional circuit for achieving a predetermined function, said at least one functional circuit in each of said bit slice cells being arranged in at least one row and interconnected, said integrated circuit device being divided into a first region in which said bit slice cells are placed and a second region surrounding said first region, and said integrated circuit device further comprising a drive line surrounding said first region in said second region and used for driving said functional circuits.

2. The integrated circuit device of claim 1, wherein said at least one functional circuit is arranged in a plurality of rows in at least one of said bit slice cells.

3. The integrated circuit device of claim 1, wherein said drive line is a power supply line for supplying power source to said functional circuits.

4. The integrated circuit device of claim 3, further comprising:

a first power source trunk line provided in said first region and connected to said power supply line at a connecting point; and a second power source trunk line provided in said second region and connected to said power supply line at said connecting point.

5. The integrated circuit device of claim 3, further comprising:

a first power source trunk line provided in said first region and connected to said power supply line at a first connecting point; and a second power source trunk line provided in said second region and connected to said power supply line at a second connecting point different from said first connecting point.

6. The integrated circuit device of claim 1, wherein said drive line is a clock line for supplying a clock signal to said functional circuits.

7. The integrated circuit device of claim 6, further comprising:

a first clock trunk line provided in said first region and connected to said clock line at a connecting point; and a second clock trunk line provided in said second region and connected to said clock line at said connecting point.

8. The integrated circuit device of claim 6, further comprising:

a first clock trunk line provided in said first region and connected to said clock line at a first connecting point; and a second clock trunk line provided in said second region and connected to said clock line at a second connecting point different from said first connecting point.

9. The integrated circuit device of claim 1, wherein said at least one functional circuit is arranged in a row in each of said bit slice cells.

10. The integrated circuit device of claim 9, wherein at least one of said functional circuits is an arithmetic circuit for performing an arithmetic operation in at least one of said bit slice cells.

11. The integrated circuit device of claim 10, wherein at least one of said functional circuits is a register circuit for holding data in at least one of said bit slice cells.

12. The integrated circuit device of claim 11, wherein at least one of said functional circuits is a logic circuit for performing a logic processing on data in at least one of said bit slice cells.

13. The integrated circuit device of claim 9, wherein said functional circuits which achieve the same function form a functional block, and said functional circuits are arranged in a column for each functional block.

14. The integrated circuit device of claim 13, said integrated circuit device being divided into a first region in which said bit slice cells are placed and a second region different from said first region, said integrated circuit device further comprising:

a connecting line; and a memory circuit connected to said functional circuits with said connecting connecting line is minimized.

15. The integrated circuit device of claim 14, wherein said memory circuit includes a ROM.

16. The integrated circuit device of claim 15, wherein said ROM has at least a first connecting terminal connected to said connecting line, said integrated circuit device further comprising:

at least a second connecting terminal corresponding to said at least first connecting terminal provided on the boundary between said first and second regions for connecting said connecting line and said functional circuits to each other, each of said at least a first and a second connecting terminals being aligned in first and second, rows, respectively.

17. The integrated circuit device of claim 16, wherein said first and second terminals are aligned in opposed relation to each other.

18. The integrated circuit device of claim 14, wherein said memory circuit includes a PLA.

19. The integrated circuit device of claim 18, wherein said PLA has a first connecting terminal connected to said connecting line, said integrated circuit device further comprising:

a second connecting terminal corresponding to said first connecting terminal provided on the boundary between said first and second regions for connecting said connecting line and said functional circuits to each other, said first and second connecting terminals being aligned in first and second, opposed rows, respectively.

20. The integrated circuit device of claim 19, wherein said first and second terminals are opposed to each other.

21. The integrated circuit device of claim 14, wherein said second region surrounds said first region, said integrated circuit device further comprising a power supply line surrounding said first region in said second region for supplying power source to said memory circuit.

22. The integrated circuit device of claim 21, wherein said memory circuit includes a ROM.

23. The integrated circuit device of claim 21, wherein said memory circuit includes a PLA.

24. The integrated circuit device of claim 21, further comprising:

a first power source trunk line provided in said first region and connected to said power supply line at a connecting point; and a second power source trunk line provided in said second region and connected to said power supply line at said connecting point.

25. The integrated circuit device of claim 21, further comprising:

a first power source trunk line provided in said first region and connected to said power supply line at a first connecting point; and a second power source trunk line provided in said second region and connected to said power supply line at a second connecting point different from said first connecting point.

26. The integrated circuit device of claim 1, further comprising a clock driver for driving said functional circuits, said integrated circuit device being divided into a first region in which said bit slice cells are placed and a second region in which said clock driver is placed.

27. The integrated circuit device of claim 26, wherein said functional circuit is arranged in a row in each of said bit slice cells, and said clock driver is provided in corresponding relation to said bit slice cells.

28. The integrated circuit device of claim 26, wherein said functional circuits which achieve the same function form a functional block, said functional circuits are arranged in a column for each functional block, and said clock driver is provided in corresponding relation to said functional blocks.

29. A method of designing an integrated circuit device, comprising the steps of:

(a) specifying a predetermined range;

(b) placing a connecting terminal at an edge of said predetermined range;

(c) placing a plurality of bit slice cells generally in parallel in said predetermined range, each of said bit cells including at least one functional circuit for achieving a predetermined function;

(d) placing one of said functional circuits in a first one of said bit slice cells to determine routing of wiring in said first bit slice cell;

(e) placing another one of said functional circuits in an N-th one of said bit slice cells (where N is an integer more than 1) in consideration for placement and routing information of said functional circuit of an M-th one of said bit slice cells (where M is a natural number less than N) to determine routing of wiring in said N-th bit slice cell; and (f) determining routing of wiring between said functional circuits.

30. A method of designing an integrated circuit device, comprising the steps of:

(a) making a logic design for an integrated circuit performing a predetermined processing to determine a logic design circuit;

(b) dividing said logic design circuit into units of said predetermined processing to determine a plurality of bit slice cells each having at least one functional circuit for achieving a predetermined function;

(c) placing one of said functional circuits in a first one of said bit slice cells to determine routing of wiring in said first bit slice cell (d) placing another one of said functional circuits in an N-th one of said bit slice cells (where N is an integer more than 1) in consideration for placement and routing information of said functional circuit of an M-th one of said bit slice cells (where M is a natural number less than N) to determine routing of wiring in said N-th bit slice cell; and (e) determining routing of wiring between said functional circuits.

31. The method of claim 30, wherein said M is equal to 1.

32. A method of designing an integrated circuit device, comprising the steps of:

(a) making a logic design for an integrated circuit performing a predetermined processing to determine a logic design circuit;

(b) dividing said logic design circuit into functional circuits each for achieving a predetermined function;

(c) specifying a predetermined region;

(d) dividing said predetermined region into units of said predetermined processing to determine bit regions;

(e) placing said functional circuits across said plurality of said bit regions; and (f) determining routing of wiring between said functional circuits.

33. A method of designing an integrated circuit device, comprising the steps of:

(a) making a logic design for an integrated circuit performing a predetermined processing to determine a logic design circuit;

(b) dividing said logic design circuit to determine a plurality of functional circuit blocks each including at least one functional circuit for achieving the same function;

(c) specifying a predetermined region;

(d) dividing said predetermined region into units of said predetermined processing to determine bit regions;

(e) placing said functional circuit blocks across at least two of said bit regions; and (f) determining routing of wiring between said functional circuits.

34. The method of claim 33, wherein said step (b) includes the step of:

(b-1) dividing said functional circuit blocks into units of said predetermined processing, and said step (c) includes the step of:

(c-1) placing said functional circuits in said bit regions, respectively, in accordance with said processing units.

* * * * *